(12) United States Patent
Rosselli et al.

(10) Patent No.: US 11,352,500 B2
(45) Date of Patent: Jun. 7, 2022

(54) SQUARAINE-BASED MOLECULES AS MATERIAL FOR ORGANIC PHOTOELECTRIC CONVERSION LAYERS IN ORGANIC PHOTODIODES

(71) Applicant: Sony Corporation, Tokyo (JP)

(72) Inventors: Silvia Rosselli, Stuttgart (DE); David Danner, Stuttgart (DE); Ameneh Bamedi Zilai, Stuttgart (DE); Gabriele Nelles, Stuttgart (DE); Tzenka Miteva, Stuttgart (DE); Gerda Fuhrmann, Stuttgart (DE)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/544,923

(22) PCT Filed: Jan. 22, 2016

(86) PCT No.: PCT/EP2016/051336
§ 371 (c)(1),
(2) Date: Jul. 20, 2017

(87) PCT Pub. No.: WO2016/120166
PCT Pub. Date: Aug. 4, 2016

(65) Prior Publication Data
US 2018/0273760 A1 Sep. 27, 2018

(30) Foreign Application Priority Data
Jan. 27, 2015 (EP) .................................... 15152662

(51) Int. Cl.
*C09B 57/00* (2006.01)
*C09B 23/00* (2006.01)
(Continued)

(52) U.S. Cl.
CPC ........ *C09B 57/007* (2013.01); *C09B 23/0025* (2013.01); *C09B 23/0066* (2013.01);
(Continued)

(58) Field of Classification Search
CPC ... C09B 23/00; C09B 57/007; C09B 23/0025; C09B 23/0066; C09B 23/0075;
(Continued)

(56) References Cited

U.S. PATENT DOCUMENTS 3,511,879 A 5/1970 Fuks et al.
4,585,884 A * 4/1986 Lin ..................... G03G 5/0611
556/413

(Continued)

FOREIGN PATENT DOCUMENTS

EP 1 970 959 A2 9/2008
JP 2000-285978 A 10/2000
(Continued)

OTHER PUBLICATIONS

International Search Report and Written Opinion dated Jul. 21, 2016 in PCT/EP2016/051336 filed Jan. 22, 2016.
(Continued)

*Primary Examiner* — Ling Siu Choi
*Assistant Examiner* — Ronald Grinsted
(74) *Attorney, Agent, or Firm* — Oblon, McClelland, Maier & Neustadt, L.L.P.

(57) ABSTRACT

An active material for organic image sensors, where the active material is a squaraine-based active material or a thiophene-based active material. A photoelectric conversion layer containing the active material, which is a squaraine-based active material or a thiophene-based active material. An organic image sensor containing the photoelectric conversion layer containing the active material.

28 Claims, 12 Drawing Sheets

(51) Int. Cl.
| | |
|---|---|
| G02B 5/20 | (2006.01) |
| H01L 27/28 | (2006.01) |
| H01L 27/30 | (2006.01) |
| H01L 51/00 | (2006.01) |
| H01L 51/42 | (2006.01) |
| H01L 51/44 | (2006.01) |
| C09B 23/01 | (2006.01) |

(52) U.S. Cl.
CPC .......... C09B 23/0075 (2013.01); G02B 5/208 (2013.01); H01L 27/286 (2013.01); H01L 27/307 (2013.01); H01L 51/0052 (2013.01); H01L 51/0058 (2013.01); H01L 51/0059 (2013.01); H01L 51/0067 (2013.01); H01L 51/0068 (2013.01); H01L 51/0069 (2013.01); H01L 51/0071 (2013.01); H01L 51/0072 (2013.01); H01L 51/0074 (2013.01); H01L 51/0094 (2013.01); H01L 51/4253 (2013.01); H01L 51/442 (2013.01); H01L 51/0053 (2013.01); H01L 51/0078 (2013.01); H01L 51/424 (2013.01); H01L 51/4213 (2013.01); Y02E 10/549 (2013.01)

(58) Field of Classification Search
CPC ....... C09B 5/208; G02B 5/208; H01L 27/286; H01L 27/307; H01L 51/0052; H01L 51/0058; H01L 51/0059; H01L 51/0067; H01L 51/0068; H01L 51/0069; H01L 51/0071; H01L 51/0072; H01L 51/0074; H01L 51/0094; H01L 51/4253; H01L 51/442; H01L 51/0053; H01L 51/0078; H01L 51/4213; H01L 51/424; Y02E 10/549
USPC .......................... 525/54.4; 136/256; 252/586
See application file for complete search history.

(56) References Cited

U.S. PATENT DOCUMENTS

| | | | | |
|---|---|---|---|---|
| 6,538,129 | B1* | 3/2003 | Terpetschnig ......... | C07H 21/00 435/5 |
| 8,232,471 | B2 | 7/2012 | Nomura et al. | |
| 8,614,440 | B2 | 12/2013 | Sramek et al. | |
| 8,822,111 | B2* | 9/2014 | Fujita .................... | C09B 57/007 430/7 |
| 2008/0230123 | A1 | 9/2008 | Mitsui et al. | |
| 2010/0212737 | A1* | 8/2010 | Fuhrmann ............ | H01G 9/2059 136/256 |
| 2012/0025179 | A1 | 2/2012 | Mitsui et al. | |
| 2014/0054577 | A1 | 2/2014 | Mitsui et al. | |
| 2014/0350183 | A1* | 11/2014 | Chiu ..................... | C09B 69/105 525/54.1 |

FOREIGN PATENT DOCUMENTS

| | | | |
|---|---|---|---|
| JP | WO2005121127 | * | 12/2005 |
| JP | 2006-63034 A | | 3/2006 |
| JP | 2008-145480 | * | 6/2008 |
| JP | 4677314 B2 | | 4/2011 |
| JP | 2012-13945 A | | 1/2012 |
| JP | 201213945 | * | 1/2012 |
| JP | 4945146 B2 | | 6/2012 |
| WO | 2005/122320 A1 | | 12/2005 |
| WO | WO 2005/121098 A1 | | 12/2005 |
| WO | WO 2005/121127 A1 | | 12/2005 |
| WO | WO 2008/023489 A1 | | 2/2008 |
| WO | WO 2012/109232 A2 | | 8/2012 |
| WO | WO2012109232 | * | 8/2012 |

OTHER PUBLICATIONS

Merrit et al., "Non-Patent Result: Organic Photovoltaic Materials: Squarylium and Cyanine-TCNQ Dyes," IBM Journal of Research and Development, vol. 22, No. 4, Jul. 1978, 2 pages (Abstract Only).

Gassensmith, Jeremiah J. et al., "Self-Assembly of Fluorescent Inclusion Complexes in Competitive Media Including the Interior of Living Cells," Journal of the American Chemical Society, vol. 129, No. 48, Dec. 2007, XP055067880, pp. 15054-15059.

Griffiths, John et al., "Facile preparative redox chemistry of bis(4-dialkylaminophenyl)squaraine dyes," Tetrahedron Letters, Pergamon, GB, vol. 43, No. 43, Oct. 2002, XP004385648, pp. 7669-7671.

Ashwell, Geoffrey J. et al., "Aggregation-Induced Linear and Non-Linear Optical Properties of Four Hydroxy-Substituted Analogues of 2,4-Bis[4-(dibutylamino)phenyl]squaraine," Australian Journal of Chemistry, vol. 51, 1998, XP002756793, 7 pages.

Houk, Ronald J.T. et al., "A colorimetric chemodosimeter for Pd(II): a method for detecting residual palladium in cross-coupling reactions," Tetrahedron, Elsevier Science Publishers, Amsterdamn, NL, vol. 64, No. 36, Sep. 2008, XP023315786, pp. 8271-8278.

Fuks, R., "Alkylation, Protonation and Bromination of Ynamines," Bull. Soc. Chim. Belg., vol. 86, No. 3, 1977, XP002756794, pp. 219-235.

Schulte, Norbert et al., "N,N-Bis(trimethylsilyl)ynamines: Cycloaddition Reactions with Dimethyl Acetylenedicarboxylate and Ketenes," Chem. Ber., vol. 127, 1994, XP002756795, pp. 1287-1293.

Baldwin, John E., "Structure and Rearrangement of Neutral Phenylketene Dimer," Journal of the American Chemical Society, vol. 85, 1963, XP002756796, pp. 2444-2445.

Zhao, Wei et al., "Study on squarylium cyanine dyes for photoelectric conversion," Solar Energy Materials and Solar Cells, Elsevier Science Publishers, Amsterdam, NL, vol. 58, No. 2, Jun. 1999, XP004177953, 11 pages.

European Office Action dated Aug. 22, 2018 and received on Oct. 19, 2018 in Patent Application No. 16 701 456.2, 6 pages.

Office Action dated Jul. 10, 2018 in corresponding Japanese Patent Application No. 2017-539597 (with Partial English Translation), citing documents AO-AU and AW-AZ therein, 9 pages.

Siyi Wang et al., "N,N-Diaryl/anilinosquaraines and Their Application to Organic Photovoltaics", Chem. Mater., 2011, vol. 23, pp. 4789-4798.

Guodan Wei et al., "Functionalized Squaraine Donors for Nanocrystalline Organic Photovoltaics", ACS NANO, 2012, vol. 6, No. 1, pp. 972-978.

Jeramy D. Zimmerman, "Control of Interface Order by Inverse Quasi-Epitaxial Growth of Squaraine/ Fullerene Thin Film Photovoltaics", ACS NANO, vol. 7, No. 10, 2013, pp. 9268-9275.

Xin Xiao et al., "Small-Molecule Photovoltaics Based on Functionalized Squaraine Donor Blends", Adv. Mater., 2012, vol. 24, pp. 1956-1960.

* cited by examiner

UV-Vis in thin film

UV-Vis in solution

SQUARAINE-BASED MOLECULES AS MATERIAL FOR ORGANIC PHOTOELECTRIC CONVERSION LAYERS IN ORGANIC PHOTODIODES

CROSS REFERENCE TO RELATED APPLICATIONS

This application is a National Stage entry under 35 U.S.C. 371 of PCT/EP2016/051336, filed on Jan. 22, 2016, and claims priority to European Patent Application No. 15152662.1, filed on Jan. 27, 2015, the entire contents of which are incorporated herein by reference.

BACKGROUND

The field of the DISCLOSURE lies in active materials for organic image sensors.

The present disclosure relates to squaraine and thiophene-based active materials and their use in photoelectric conversion layer(s) and/or an organic image sensor and methods for their synthesis.

The present disclosure also relates to photoelectric conversion layer(s) comprising an active material according to the present disclosure, to a device, comprising active material(s) according to the present disclosure or photoelectric conversion layer(s) according to the present disclosure.

Moreover, the present disclosure relates to an organic image sensor comprising photoelectric conversion layer(s) according to the present disclosure.

DESCRIPTION OF THE RELATED ART

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

Image sensors, which are semiconductor devices for converting an optical image into an electric signal, include a light-sensing unit for sensing light and a logic circuit unit for processing the sensed light into an electrical signal to store data.

In the state of the art, the light-sensing unit includes a color filter and a photoelectric conversion film, a semiconductor p-n junction, such as silicon. The color filter separates light according to colors, but reduces the spatial resolution and light collection and utilization efficiency.

In order to overcome this problem geometries are reported where photoelectric conversion units capable of detecting light of different wavelengths are stacked in a longitudinal direction. In particular such photoelectrical conversion unit is an organic photoelectric conversion layer based on p-n junction or bulk heterojunction. The photoelectric conversion efficiency of such a unit depends strongly on the type of material used in the layer. With the organic materials available so far, low conversion efficiencies and high dark currents are reported.

In another solution, an organic layer is used that is capable to absorb in the IR region but not in the visible region, that could be combined with a complementary metal oxide semiconductor (CMOS) based imager part for the visible range or with an organic based imager part that could absorb in the visible range. In both cases white light is collected and filter have to be used to get the BGR pixel resolution. In this case, as well as in the case of color filter, light is separated according to colors but the spatial resolution and light collection and utilization efficiency is reduced.

SUMMARY

The present disclosure provides a (squaraine) molecule represented by formula I

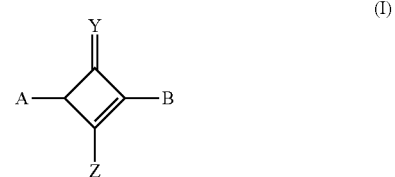

wherein
A and B are the same or different and are, at each occurrence, independently selected from

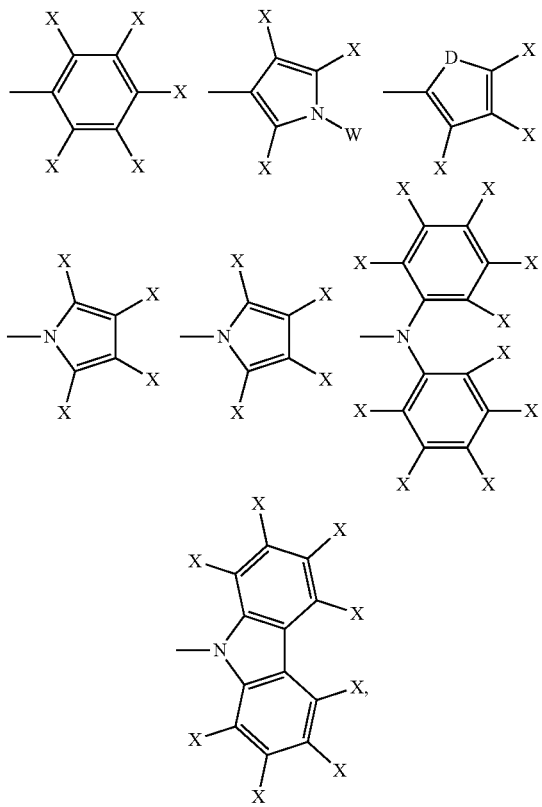

pyrazole, thiazole, imidazole, indole, quinoline, benzothiophene, benzothiazole, benzothiadiazole, benzofuran, oxazole, benzoxazole, pyridine, diazine, triazine, selenophene, naphthalene, anthracene or pyrene, any of which can optionally be substituted, D is S or O;

W is selected from H, alkyl, aryl;

X is selected from the group comprising H, OH, SH, $NH_2$, NHR, $NR_2$, $NO_2$, alkyl, alkoxy, aryl, aryloxy, halogen, such as F, Cl, Br, I;

Y is selected from O, S, NH, NR,

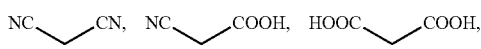

indanedione, barbituric acid or thiobarbituric acid;

Z is selected from OH, SH, $NH_2$, $NR_2$;

R, at each occurrence, is independently selected from H or any straight or branched alkyl chain of general formula —$C_nH_{2n+1}$, or —$COOR^1$, —$OR^1$, —$SR^1$, —$NR^1{}_2$, or F, Cl, Br, I, O, N, $NO_2$, CN, $CF_3$, wherein $R^1$ is H or any straight or branched alkyl chain of general formula —$C_nH_{2n+1}$, or any substituted or non-substituted phenyl or biphenyl, heteroaryl, n=0-12, preferably 0-6.

The present disclosure provides a (thiophene-based) molecule represented by a formula selected from formula II, III, IV, V and VI

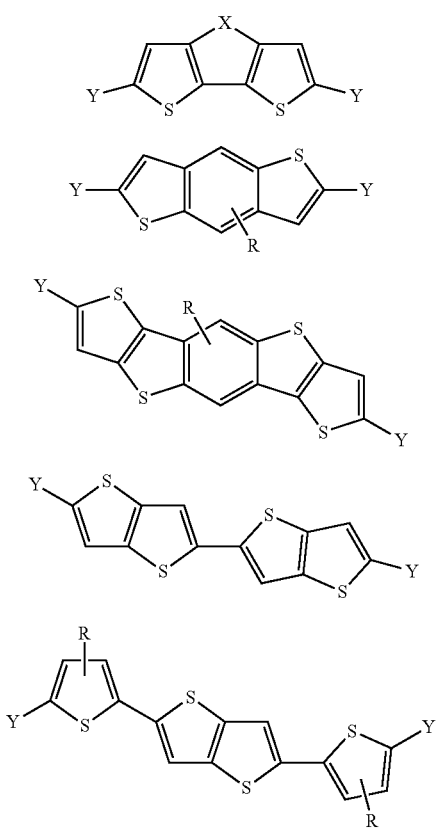

wherein

X is selected from the group comprising S, Se, N—$R^1$, $SO_2$, $CR^1{}_2$, cyclopentane, cyclohexane, $SiR^1{}_2$;

$R^1$ is selected from aryl, alkyl;

R is selected from H, aryl, substituted aryl, alkyl, thiophene, alkyl-substituted thiophene;

Y is selected from

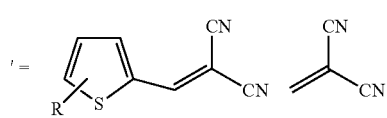

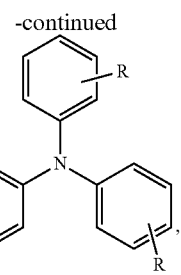

carbazole, diarylamine, pyrrole, pyrazole, thieno[3,4-b]pyrazine, imidazole, thiazole, fluorine, tricyanovinyl, indole, quinolone, benzothiadiazole, indanedione, barbituric acid or thiobarbituric acid, rhodanine, thiazolinedione derivatives as for example:

The present disclosure provides the use of a molecule according to the present disclosure in an absorption layer, in a filter and/or in a photoelectric conversion layer and/or in an organic and/or hybrid module for optoelectronic application.

The present disclosure provides a photoelectric conversion layer comprising a molecule according to the present disclosure. The present disclosure provides an absorption layer comprising a molecule according to the present disclosure. The present disclosure provides a filter comprising a molecule according to the present disclosure.

The present disclosure provides a device comprising molecule(s) according to the present disclosure or a photoelectric conversion layer(s) according to the present disclosure.

The present disclosure provides an organic image sensor, comprising an organic photoelectric conversion unit comprising photoelectric conversion layer(s) according to the present disclosure.

The present disclosure provides a hybrid Silicon-organic image sensor, comprising an organic photoelectric conversion unit comprising photoelectric conversion layer(s) according to the present disclosure.

The present disclosure provides a method for synthesis of a (squaraine) molecule according to the present disclosure.

The present disclosure provides a method for synthesis of a (thiophene-based) molecule according to the present disclosure.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
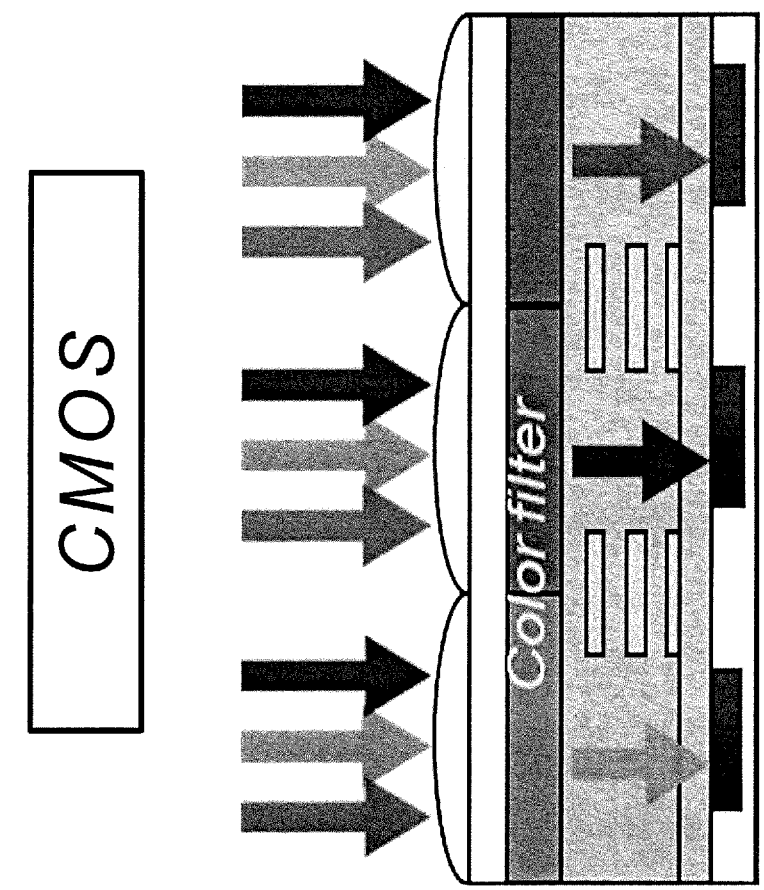
FIG. 1 shows a CMOS image sensor.

As discussed above, the present disclosure provides a squaraine molecule represented by formula I

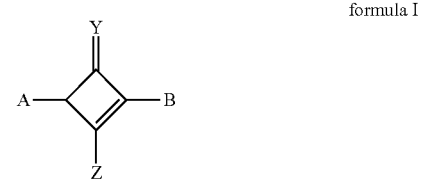

formula I wherein

A and B are the same or different and are, at each occurrence, independently selected from

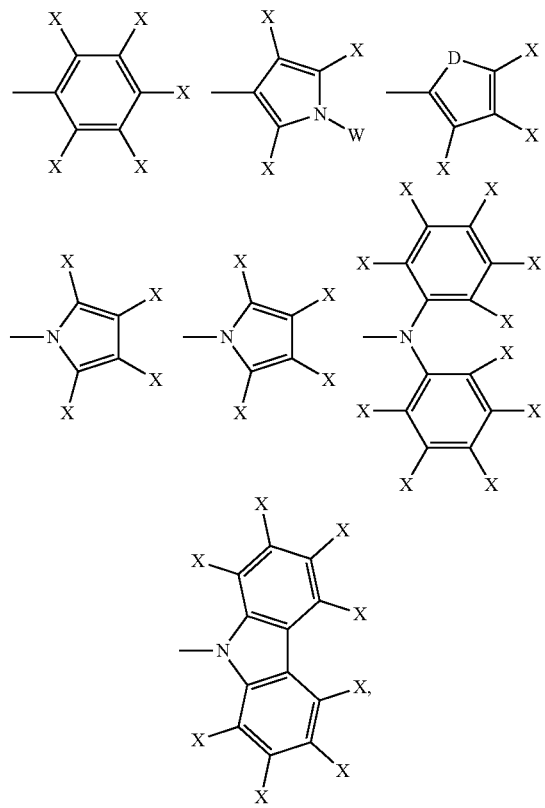

pyrazole, thiazole, imidazole, indole, quinoline, benzothiophene, benzothiazole, benzothiadiazole, benzofuran, oxazole, benzoxazole, pyridine, diazine, triazine, selenophene, naphthalene, anthracene or pyrene, any of which can optionally be substituted, D is S or O;

W is selected from H, alkyl, aryl;

X is selected from the group comprising H, OH, SH, $NH_2$, NHR, $NR_2$, $NO_2$, alkyl, alkoxy, aryl, aryloxy, halogen, such as F, Cl, Br, I:

Y is selected from O, S, NH, NR,

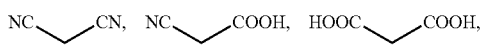

indanedione, barbituric acid or thiobarbituric acid;

Z is selected from OH, SH, $NH_2$, $NR_2$;

R, at each occurrence, is independently selected from H or any straight or branched alkyl chain of general formula $—C_nH_{2n+1}$, or $—COOR^1$, $—OR^1$, $—SR^1$, $—NR^1{}_2$, or F, Cl, Br, I, O, N, $NO_2$, CN, $CF_3$, wherein $R^1$ is H or any straight or branched alkyl chain of general formula $—C_nH_{2n+1}$, or any substituted or non-substituted phenyl or biphenyl, heteroaryl, n=0-12, preferably 0-6.

In one embodiment, the squaraine molecule comprises a spacer, such as a double bond, e.g. in an embodiment, where A and/or B is indole).

Mono-, di-, tri-, tetra- and penta-substitution with X is possible.

In a preferred embodiment, the squaraine molecule is represented by formula Ia

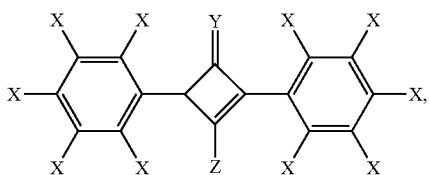

wherein X, Y and Z are as defined above.

In one embodiment, the squaraine molecule is represented by any of structures

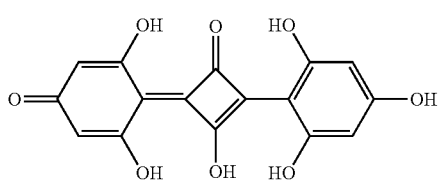

3,5-Dihydroxy-4-[2-hydroxy-4-oxo-3-(2,4,6-trihydroxy-phenyl)-cyclobut-2-enylidene]-cyclohexa-2,5-dienone

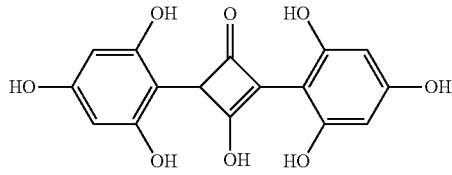

3-Hydroxy-2,4-bis-(2,4,6-trihydroxy-phenyl)-cyclobut-2-enone

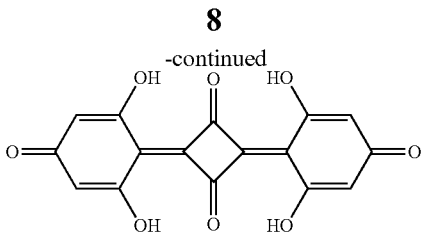

2,4-Bis-(2,6-dihydroxy-4-oxo-cyclohexa-2,5-dienylidene)-cyclobutane-1,3-dione

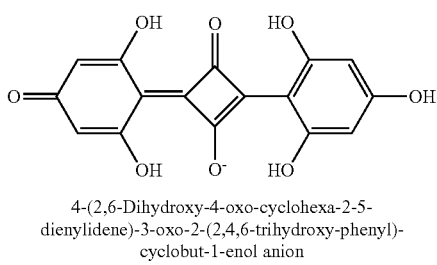

4-(2,6-Dihydroxy-4-oxo-cyclohexa-2-5-dienylidene)-3-oxo-2-(2,4,6-trihydroxy-phenyl)-cyclobut-1-enol anion

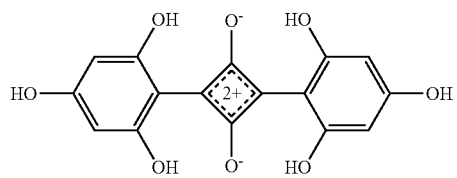

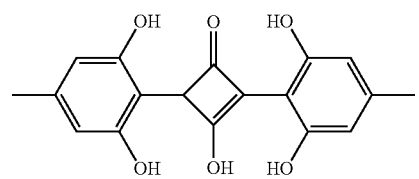

2,4-Bis-(2,6-dihydroxy-4-methoxy-phenyl)-3-hydroxy-cyclobut-2-enone

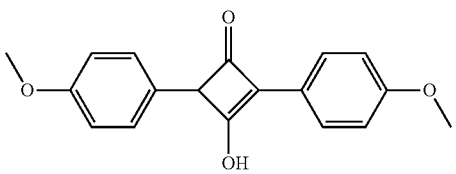

2,4-Bis-(2,6-dihydroxy-4-methyl-phenyl)-3-hydroxy-cyclobut-2-enone

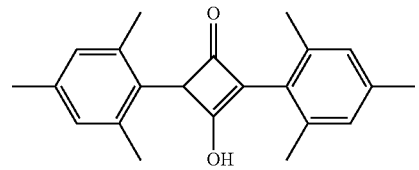

3-Hydroxy-2,4-bis-(4-methoxy-phenyl)-cyclobut-2-enone

3-Hydroxy-2,4-bis-(2,4,6-trimethyl-phenyl)-cyclobut-2-enone

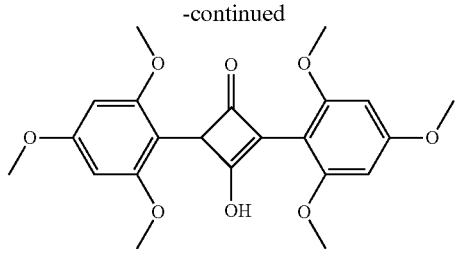

3-Hydroxy-2,4-bis-(2,4,6-trimethoxy-phenyl)-cyclobut-2-enone

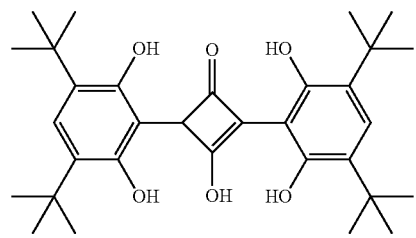

2,4-Bis-(3,5-di-tert-butyl-2,6-dihydroxy-phenyl)-3-hydroxy-cyclobut-2-enone

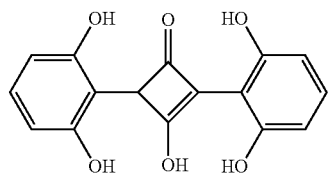

2,4-Bis-(2,6-dihydroxy-phenyl)-3-hydroxy-cyclobut-2-enone

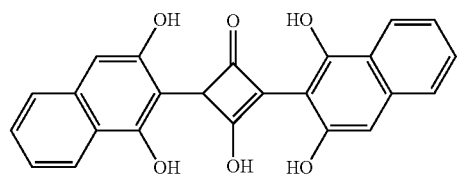

2,4-Bis-(1,3-dihydroxy-naphthalen-2-yl)-3-hydroxy-cyclobut-2-enone

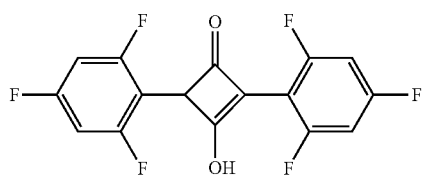

3-Hydroxy-2,4-bis-(2,4,6-trifluoro-phenyl)-cyclobut-2-enone

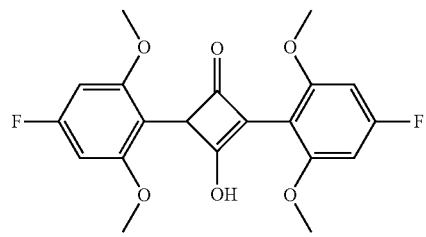

2,4-Bis-(4-fluoro-2,6-dimethoxy-phenyl)-3-hydroxy-cyclobut-2-enone

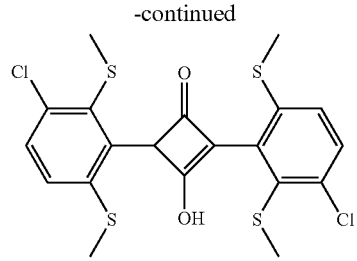

2,4-Bis-(3-chloro-2,6-bis-methylsulfanyl-phenyl)-3-hydroxy-cyclobut-2-enone

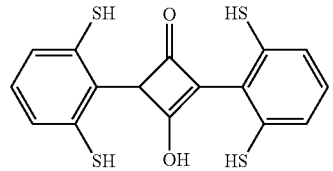

2,4-Bis-(2,6-dimercapto-phenyl)-3-hydroxy-cyclobut-2-enone

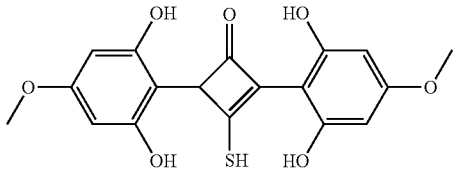

2,4-Bis-(2,6-dihydroxy-4-methoxy-phenyl)-3-mercapto-cyclobut-2-enone

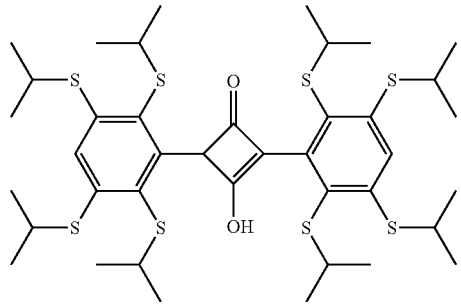

3-Hydroxy-2,4-bis-(2,3,5,6-tetrakis-isopropylsulfanyl-phenyl)-cyclobut-2-enone

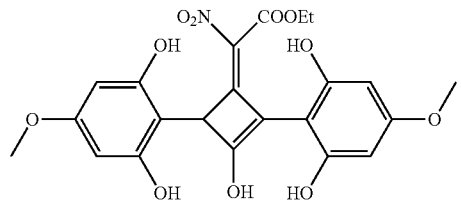

[2,4-Bis-(2,6-dihydroxy-4-methoxy-phenyl)-3-hydroxy-cyclobut-2-enylidene]-nitro-acetic acid ethyl ester

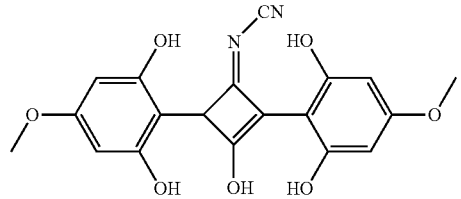

2,4-Bis-(2,6-dihydroxy-4-methoxy-phenyl)-3-hydroxy-cyclobut-2-enylidene]-cyanamide

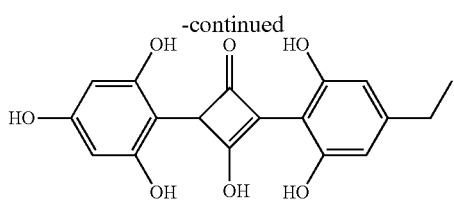

2-(4-Ethyl-2,6-dihydroxy-phenyl)-3-hydroxy-4-
(2,4,6-trihydroxy-phenyl)-cyclobut-2-enone

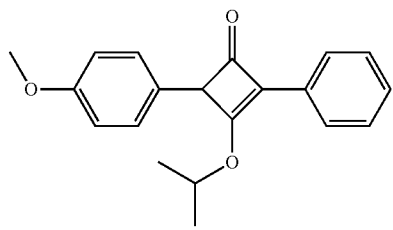

3-Isopropoxy-4-(4-methoxy-phenyl)-
2-phenyl-cyclobut-2-enone

In one embodiment, any of the above depicted substituents attached to the squaraine core can be used in combination with other substituent(s) in order to form asymmetric substituted squaraine molecules.

In a preferred embodiment, the squaraine molecule is represented by any one of

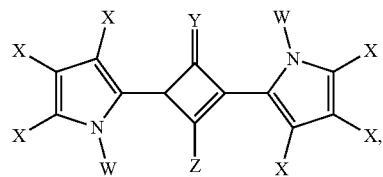

formula Ib

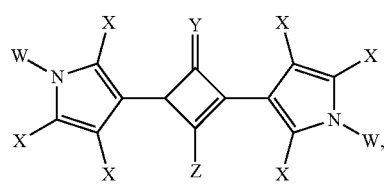

formula Ic

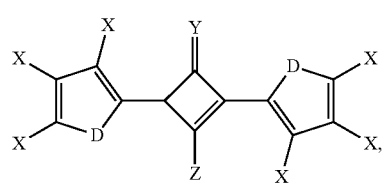

formula Id wherein D is S or O,

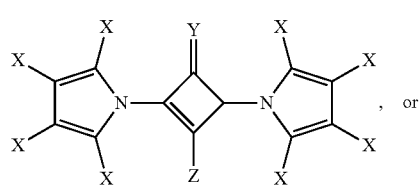

, or formula Ie

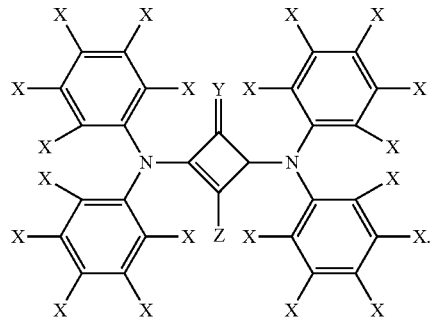

formula If

In one embodiment, the squaraine molecule is represented by any of structures

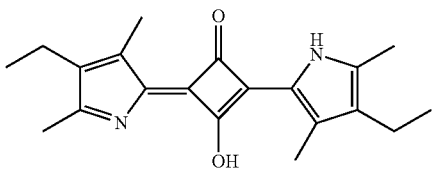

2-(4-Ethyl-3,5-dimethyl-1H-pyrrol-2-yl)-4-(4-ethyl-3,5-
dimethyl-pyrrol-2-ylidene)-3-hydroxy-cyclobut-2-enone

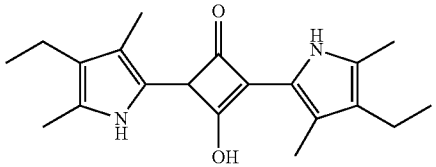

2,4-Bis-(4-ethyl-3,5-dimethyl-1H-pyrrol-2-yl)-
3-hydroxy-cyclobut-2-enone

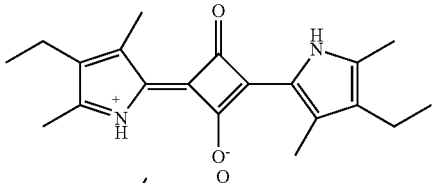

3-Oxo-2-(1,2,5-trimethyl-1H-pyrrol-3-yl)-4-(1,2,5-
trimethyl-pyrrol-3-ylidene)-cyclobut-1-enol anion

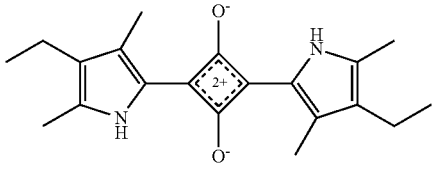

2,4-Bis-(4-ethyl-3,5-dimethyl-1H-pyrrol-2-yl)-3-hydroxy-
cyclobut-2-enone

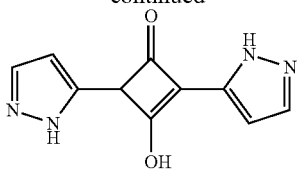

3-Hydroxy-2,4-bis-(2H-pyrazol-3-yl)-
cyclobut-2-enone

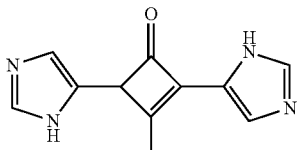

3-Hydroxy-2,4-bis-(3H-imidazol-4-yl)-
cyclobut-2-enone

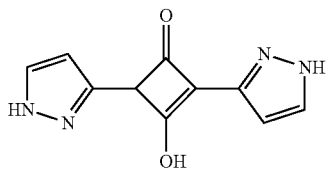

3-Hydroxy-2,4-bis-(1H-pyrazol-3-yl)-
cyclobut-2-enone

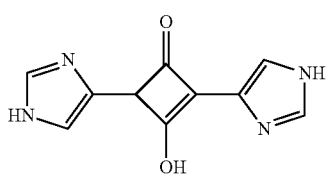

3-Hydroxy-2,4-bis-(1H-pyrazol-4-yl)-
cyclobut-2-enone

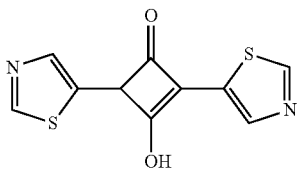

3-Hydroxy-2,4-bis-thiazol-5-yl-
cyclobut-2-enone

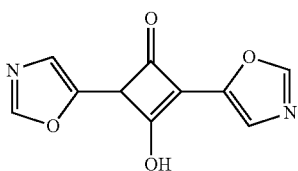

3-Hydroxy-2,4-bis-oxazol-5-yl-
cyclobut-2-enone

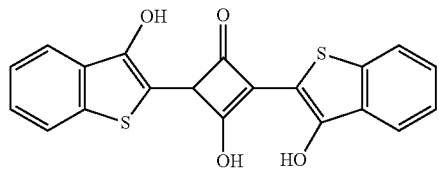

3-Hydroxy-2,4-bis-(3-hydroxy-benzo[b]thiophen-2-yl)-
cyclobut-2-enone

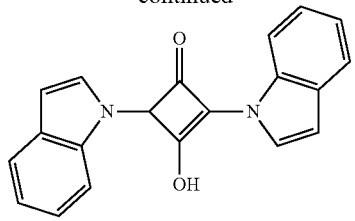

3-Hydroxy-2,4-bis-indol-1-yl-cyclobut-2-
enone

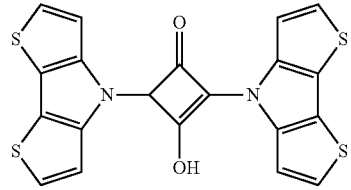

2,4-Bis-dithieno[3,2-b;2',3'-d]
pyrrol-4-yl-3-hydroxy-cyclobut-2-enone

In one embodiment, any of the above depicted substituents attached to the squaraine core can be used in combination with other substituent(s) in order to form asymmetric substituted squaraine molecules.

In a preferred embodiment, the squaraine molecule is represented by any one of formula Ig

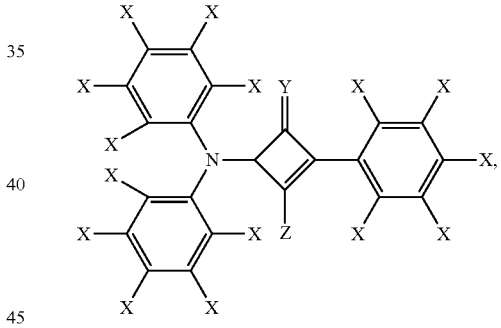

formula Ih

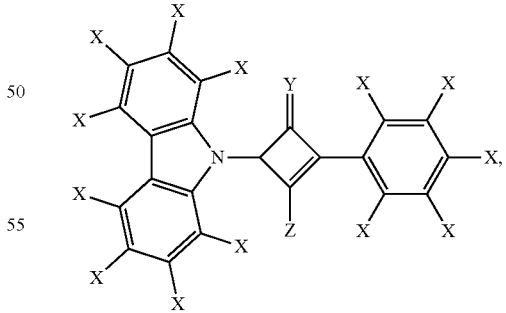

formula Ii

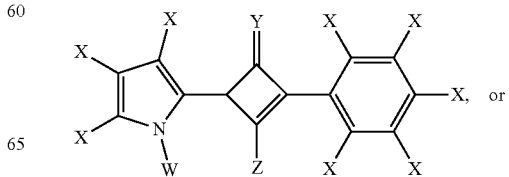

-continued

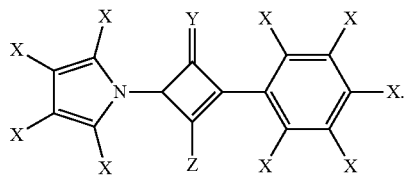

formula Ij

In one embodiment, the squaraine molecule is represented by any of structures

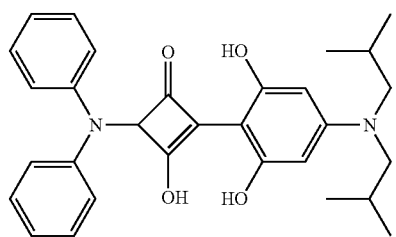

2-(4-Diisobutylamino-2,6-dihydroxy-phenyl)-4-diphenylamino-3-hydroxy-cyclobut-2-enone

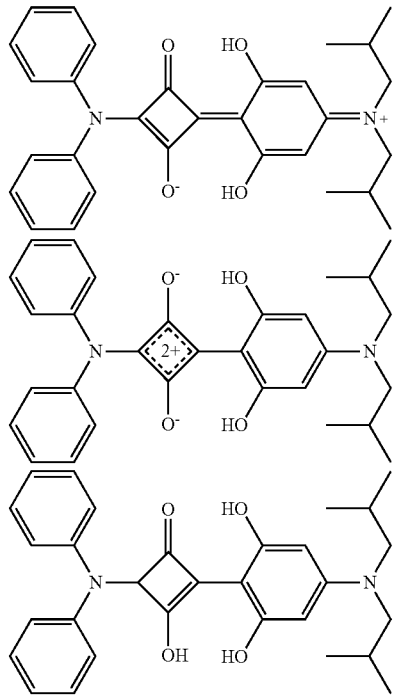

2-(4-Diisobutylamino-2,6-dihydroxy-phenyl)-4-diphenylamino-3-hydroxy-cyclobut-2-enone

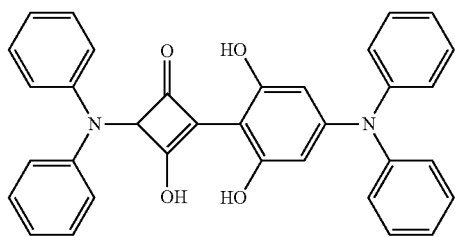

4-Diphenylamino-2-(4-diphenylamino-2,6-dihydroxy-phenyl)-3-hydroxy-cyclobut-2-enone

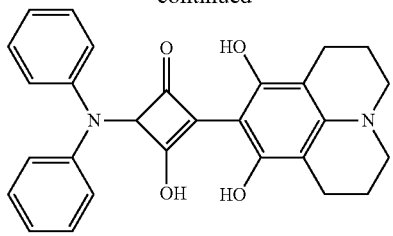

2-(8,10-Dihydroxy-2,3,6,7-tetrahydro-1H,5H-pyrido[3,2,1-ij]quinolin-9-yl)-4-diphenylamino-3-hydroxy-cyclobut-2-enone

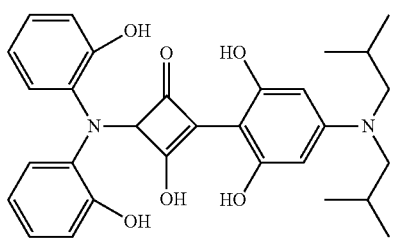

4-[Bis-(2-hydroxy-phenyl)-amino]-2-(4-diisobutylamino-2,6-dihydroxy-phenyl)-3-hydroxy-cyclobut-2-enone

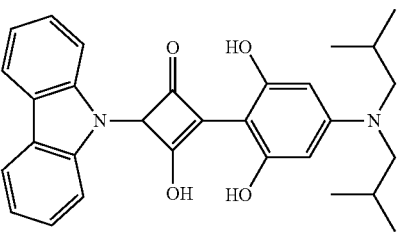

4-Carbazol-9-yl-2-(4-diisobutylamino-2,6-dihydroxy-phenyl)-3-hydroxy-cyclobut-2-enone

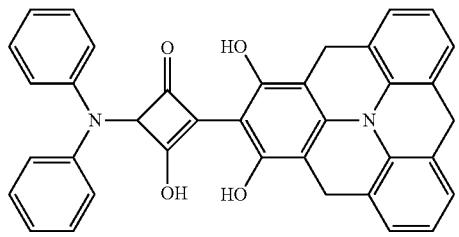

2-(1,3-Dihydroxy-4H,8H,12H-12c-aza-dibenxo[cd,mn]pyren-2-yl)-4-diphenylamino-3-hydroxy-cyclobut-2-enone

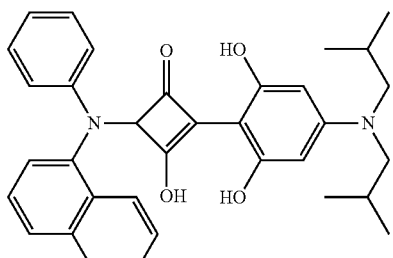

2-(4-Diisobutylamino-2,6-dihydroxy-phenyl)-3-hydroxy-4-(naphthalen-1-yl-phenyl-amino)-cyclobut-2-enone -continued

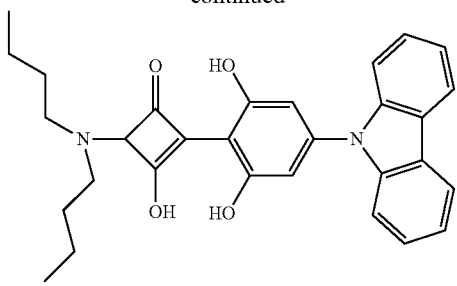

4-Dibutylamino-2-(4-diphenylamino-2,6-
dihydroxy-phenyl)-3-hydroxy-cyclobut-2-enone

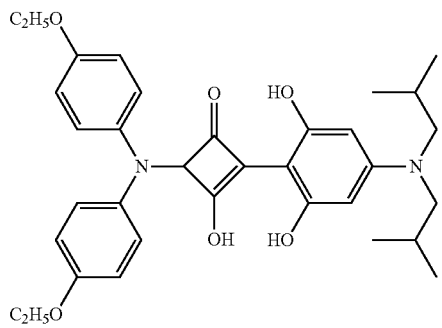

4-[Bis-(4-ethoxy-phenyl)-amino]-2-
(4-diisobutylamino-2,6-dihydroxy-phenyl)-
3-hydroxy-cyclobut-2-enone

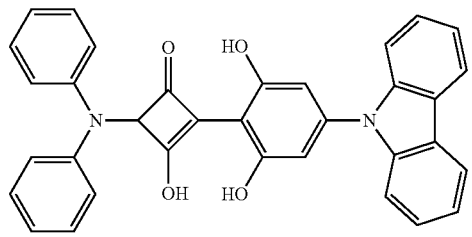

2-(4-Carbazol-9-yl-2,6-dihydroxy-phenyl)-4-diphenylamino-3-
hydroxy-cyclobut-2-enone

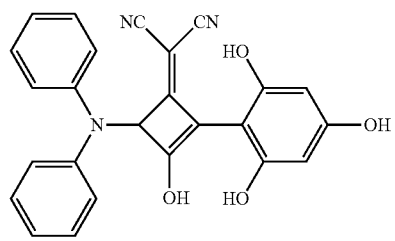

2-[4-Diphenylamino-3-hydroxy-2-
(2,4,6-trihydroxy-phenyl)-cyclobut-
2-enylidene]-malononitrile

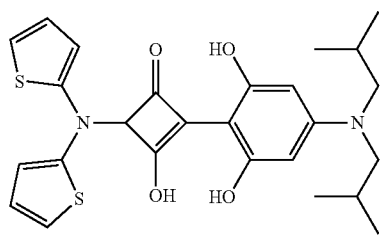

2-(4-Diisobutylamino-2,6-dihydroxy-phenyl)-
4-di-thiophen-2-yl-amino)-3-hydroxy-cyclobut-2-enone -continued

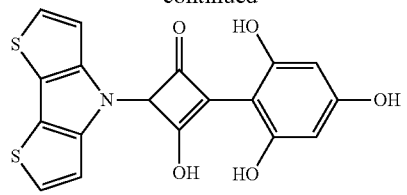

4-Dithieno[3,2-b;2′,3′-d]pyrrol-4-yl-3-hydroxy-2-
(2,4,6-trihydroxy-phenyl)-cyclobut-2-enone

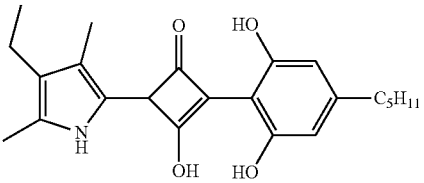

2-(2,6-Dihydroxy-4-pentyl-phenyl)-4-
(4-ethyl-3,5-dimethyl-1H-pyrrol-2-yl)-
3-hydroxy-cyclobut-2-enone

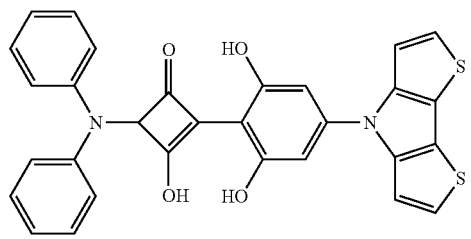

4-Diphenylamino-2-(4-dithieno[3,2-b;2′,3′-d]pyrrol-4-yl-
2,6-dihydroxy-phenyl)-3-hydroxy-cyclobut-2-enone

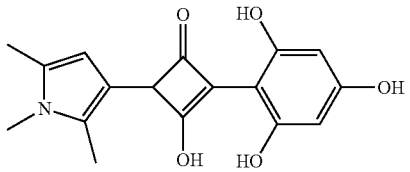

3-Hydroxy-2-(2,4,6-trihydroxy-phenyl)-4-
(1,2,5-trimethyl-1H-pyrrol-3-yl)-cyclobut-2-enone In one embodiment, the squaraine molecule is represented by any of structures

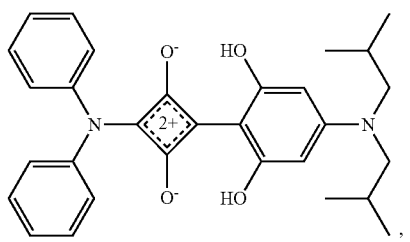

,

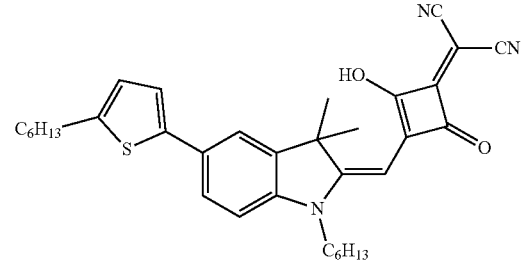

2-{3-[1-Hexyl-5-(5-hexyl-thiophen-2-yl)-3,3-dimethyl-
1,3-dihydro-indol-2-ylidenemethyl]-2-hydroxy-
4-oxo-cyclobut-2-enylidene}-malononitrile -continued

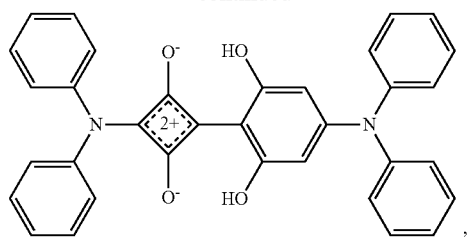

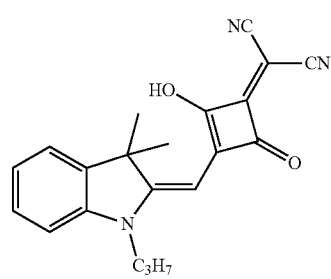

2-[3-(3,3-Dimethyl-1-propyl-1,3-dihydro-
indol-2-ylindemethyl)-2-hydroxy-4-oxo-
cyclobut-2-enylidene]-malononitrile

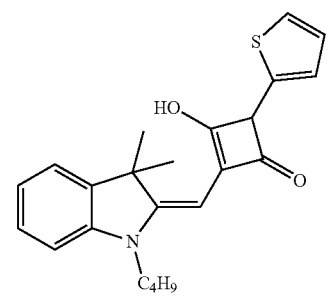

2-(1-Butyl-3,3-dimethyl-1,3-dihydro-indol-2-
ylidenemethyl)-3-hydroxy-4-thiophen-2-yl-
cyclobut-2-enone

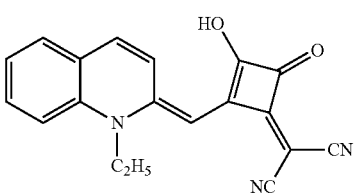

2-[2-(1-Ethyl-1H-quinolin-2-ylidenemethyl)-
3-hydroxy-4-oxo-cyclobut-
2-enylidene]-malononitrile

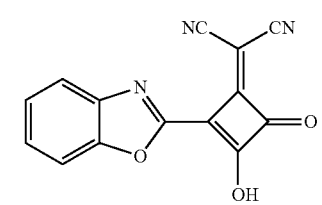

2-(2-Benzothiazol-2-yl-3-hydroxy-
4-oxo-cyclobut-2-enylidene)-malononitrile

-continued

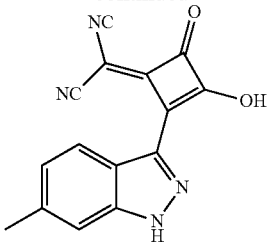

2-[3-Hydroxy-2-(6-methyl-
1H-indazol-3-yl)-4-oxo-
cyclobut-2-enylidene]-malononitrile

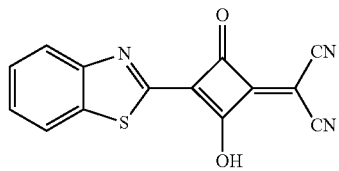

2-(3-Benzothiazol-2-yl-2-hydroxy-4-oxo-
cyclobut-2-enylidene)-malononitrile

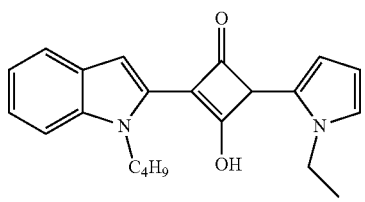

2-(1-Butyl-1H-indol-2-yl)-4-
(1-ethyl-1H-pyrrol-2-yl)-3-
hydroxy-cyclobut-2-enone

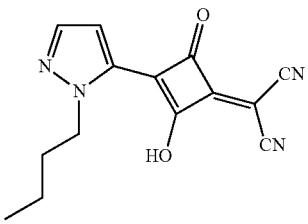

2-[3-(2-Butyl-2H-pyrazol-3-yl)-2-hydroxy-
4-oxo-cyclobut-2-enylidene]-malononitrile

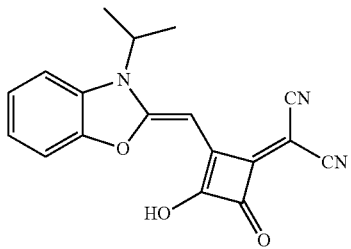

2-[3-Hydroxy-2-(3-isopropyl-3H-benzooxazol-2-
ylidenemethyl)-4-oxo-cyclobut-2-enylidene]-
malononitrile In one embodiment, the squaraine molecule is an asymmetrical molecule, with any of the shown substituents attached to the squaraine core in combination with any other substituent.

As discussed above, the present disclosure provides a thiophene-based molecule represented by a formula selected from formula II, III, IV, V and VI

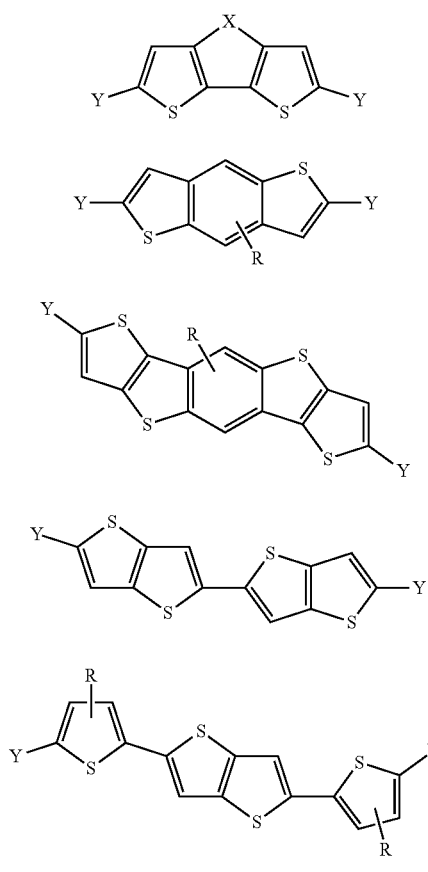

formula II formula III formula IV formula V formula VI wherein

X is selected from the group comprising S, Se, N—R¹, SO₂, CR¹₂, cyclopentane, cyclohexane, SiR¹₂;

R¹ is selected from aryl, alkyl;

R is selected from H, aryl, substituted aryl, alkyl, thiophene, alkyl-substituted thiophene;

Y is selected from

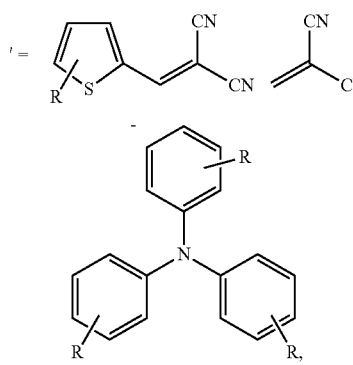

carbazole, diarylamine, pyrrole, pyrazole, thieno[3,4-b]pyrazine, imidazole, thiazole, fluorine, tricyanovinyl, indole, quinolone, benzothiadiazole, indanedione, barbituric acid or thiobarbituric acid, rhodanine, thiazolinedione derivatives as for example:

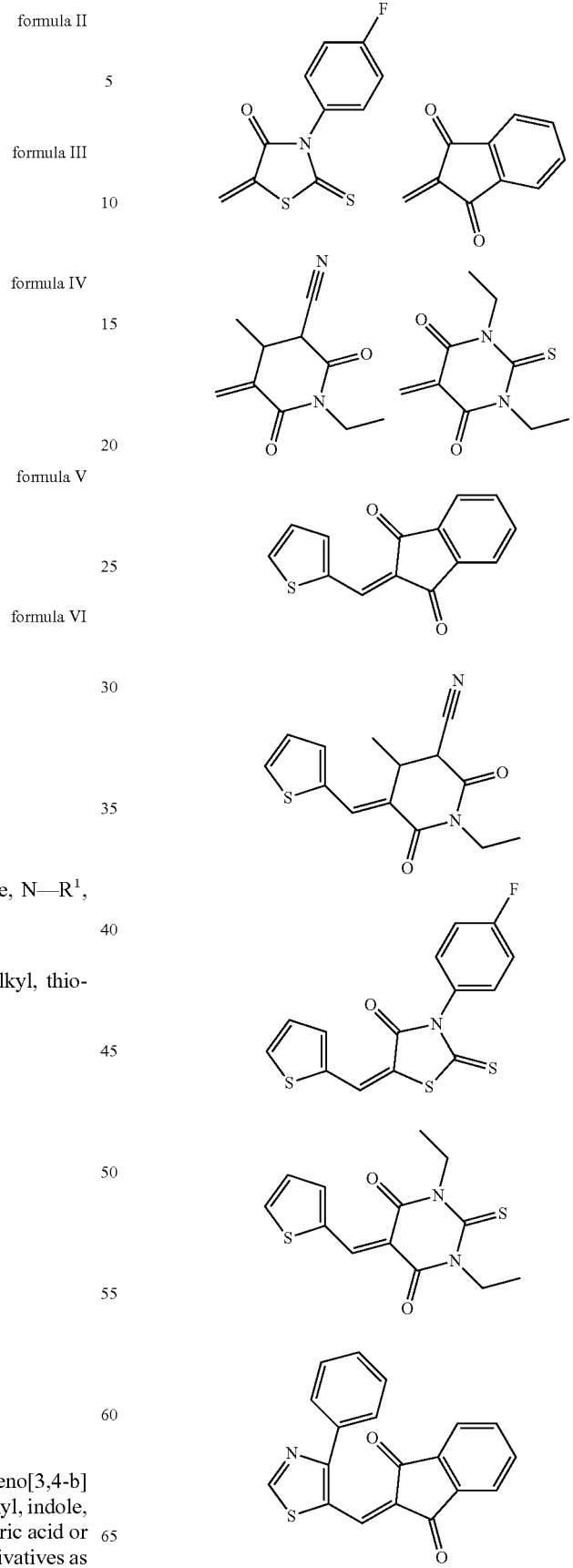

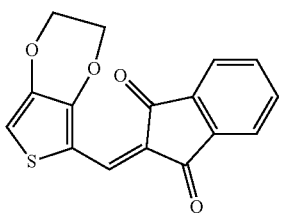 [SMILES: O=C1C(=Cc2scc3c2OCCO3)C(=O)c2ccccc21]

R is selected from H, aryl, substituted aryl, alkyl, thiophene, alkyl-substituted thiophene.

In a preferred embodiment, the thiophene-based molecule is a spiro-dimer selected from

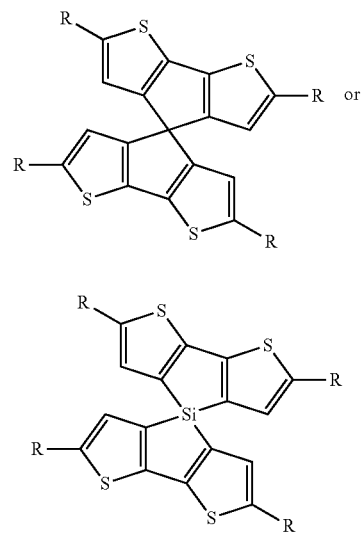

R is the same as the R defined above.

In a preferred embodiment, the thiophene-based molecule is represented by any of structures

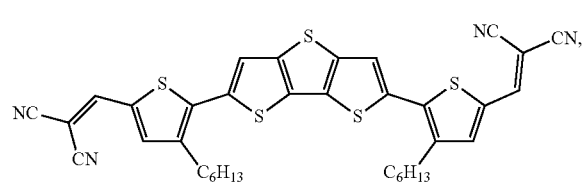

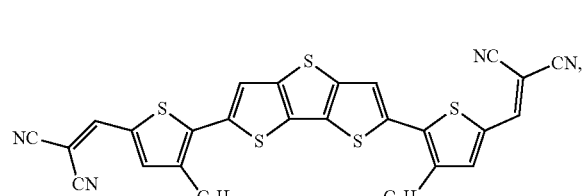

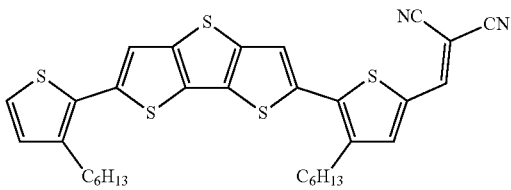

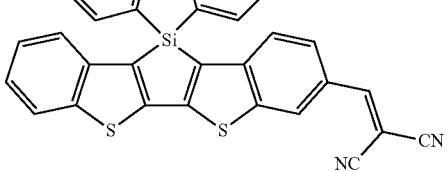

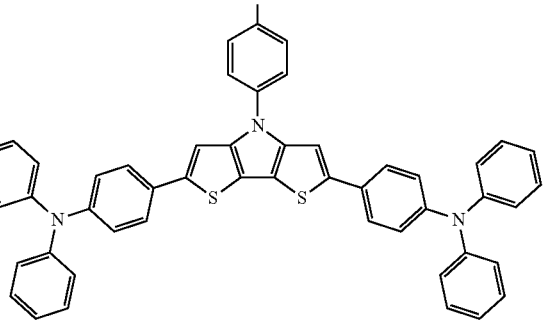

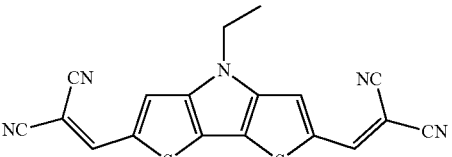

2-Cyano-3-[6-(2,2-dicyano-vinyl)-4-ethyl-4H-dithieno[3,2-b;2′,3′-o]pyrrol-2-yl]-acrylonitrile

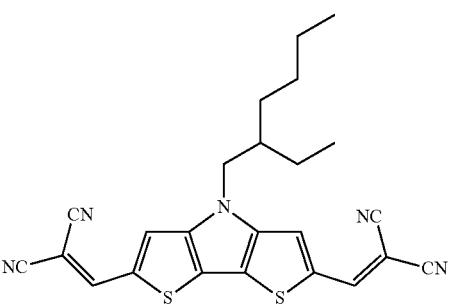

2-Cyano-3-[6-(2,2-dicyano-vinyl)-4-(2-ethyl-hexyl)-4H-dithieno[3,2-b;2′,3′-d]pyrrol-2-yl]-acrylonitrile

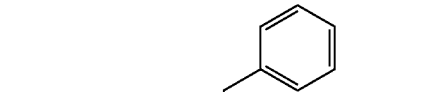

3-[4-Benzyl-6-(2,2-dicyano-vinyl)-4H-dithieno[3,2-b;2′,3′-o]pyrrol-2-yl]-2-cyano-acrylonitrile -continued

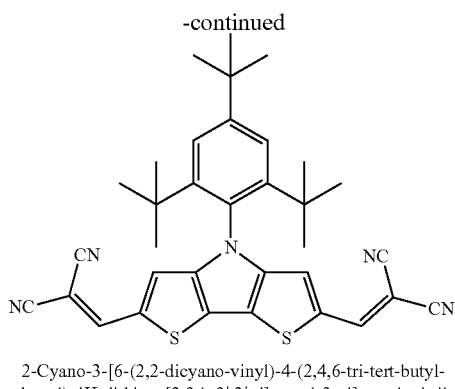

2-Cyano-3-[6-(2,2-dicyano-vinyl)-4-(2,4,6-tri-tert-butyl-phenyl)-4H-dithieno[3,2-b;2',3'-d]pyrrol-2-yl]-acrylonitrile

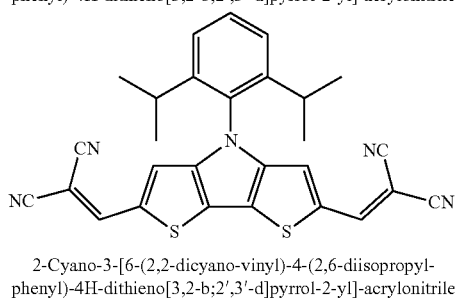

2-Cyano-3-[6-(2,2-dicyano-vinyl)-4-(2,6-diisopropyl-phenyl)-4H-dithieno[3,2-b;2',3'-d]pyrrol-2-yl]-acrylonitrile A molecule according to the present disclosure preferably exhibits absorption in the visible wavelength range (about 400 to about 700 nm), preferably in the range from 400 nm to 700 nm, or a sub-range thereof, preferably 400 nm to 500 nm, or 500 nm to 600 nm, or 600 nm to 700 nm.

A squaraine molecule represented by formula I according to the present invention preferably exhibits absorption in the visible wavelength range (about 400 to about 700 nm and exhibits no absorption in the IR range (above 700 nm).

A thiophene molecule represented by formula II, III, IV, V or VI according to the present invention preferably exhibits absorption in the visible wavelength range (about 400 to about 700 nm) and, optionally, exhibits also absorption in the IR range (above 700 nm).

In one embodiment, the molecules of the present disclosure absorb in the blue absorption range.

In one embodiment, the molecules of the present disclosure absorb in the green absorption range.

In one embodiment, the molecules of the present disclosure absorb in the red absorption range.

Preferably, the molecules absorb less than 20% (more preferably less than 5%) of the maximum absorption outside of their main range of absorption, such as, at wavelengths shorter than 500 and longer than 600 nm when absorption peak is between 500 and 600 nm.

A molecule according to the present disclosure preferably shows an extinction coefficient of $>10^4 Lmol^{-1}cm^{-1}$, more preferably of $>10^5 Lmol^{-1}cm^{-1}$.

A molecule according to the present disclosure preferably allows furthermore:
  easy alteration of HOMO and LUMO energies,
  tuning of the absorbion maximum (optical band gap) and shape over a broad range,
  tuning of the molecular packing in films.

Films prepared from the molecules of the present disclosure preferably show
  high electrons and holes mobilities,
  high exciton diffution efficiencies,
  more preferably up to 99%.

Preferably those films are homogeneous (on the nm to μm scale) and even more preferably amorphous.

A molecule according to the present disclosure preferably exhibits a high photoelectric conversion efficiency of more than 15%, preferably of more than 50% and more preferably more than 80%.

As discussed above, the present disclosure provides the use of a molecule according to the present disclosure in an absorption layer.

In this embodiment, when the molecule according to the present invention is used in an absorption layer, the molecule (encompassing the squaraine molecules represented by formula I according to the present invention and the thiophene molecules represented by formula II, III, IV, V or VI according to the present invention) preferably exhibits absorption in the visible wavelength range (about 400 to about 700 nm) and, optionally, exhibits also absorption in the IR range (above 700 nm).

As discussed above, the present disclosure provides the use of a molecule according to the present disclosure in a filter.

In this embodiment, when the molecule according to the present invention is used as/in a filter, the molecule (encompassing the squaraine molecules represented by formula I according to the present invention and the thiophene molecules represented by formula II, III, IV, V or VI according to the present invention) preferably exhibits absorption in the visible wavelength range (about 400 to about 700 nm) and, optionally, exhibits also absorption in the IR range (above 700 nm).

As discussed above, the present disclosure provides the use of a molecule according to the present disclosure in a photoelectric conversion layer and/or in an organic and/or hybrid module for optoelectronic application, such as image sensor, photodiode, organic photovoltaics, comprising organic photoelectric conversion layer(s), OLED and OTFT organic modules.

As discussed above, the present disclosure provides a photoelectric conversion layer comprising at least one molecule according to the present disclosure.

In the embodiments, where the molecule according to the present invention is used or comprised in a photoelectric conversion layer,
  when the molecule of the present invention is the squaraine molecule represented by formula I according to the present invention, the molecule preferably exhibits absorption in the visible wavelength range (about 400 to about 700 nm) and exhibits no absorption in the IR range (above 700 nm).
  when the molecule of the present invention is the thiophene molecule represented by formula II, III, IV, V or VI according to the present invention, the molecule preferably exhibits absorption in the visible wavelength range (about 400 to about 700 nm) and, optionally, exhibits also absorption in the IR range (above 700 nm).

Here the application of the molecule(s) of the present disclosure is as active layer/component of a photoelectric conversion layer.

In one embodiment, the photoelectric conversion layer comprises further molecule(s).

As discussed above, the present disclosure provides an absorption layer or filter comprising at least one molecule according to the present disclosure.

As discussed above, the present disclosure provides a filter comprising at least one molecule according to the present disclosure.

In this embodiment, when the molecule according to the present invention is comprised in an absorption layer or filter, the molecule (encompassing the squaraine molecules represented by formula I according to the present invention and the thiophene molecules represented by formula II, III, IV, V or VI according to the present invention) preferably exhibits absorption in the visible wavelength range (about 400 to about 700 nm) and, optionally, exhibits also absorption in the IR range (above 700 nm).

Here the application of the molecule(s) of the present disclosure is as filter only, i.e. the films of molecules according to this disclosure are used only to absorb the light in the specific wavelength region (without to contribute to photoelectric conversion).

In one embodiment, the absorption layer or filter comprises further molecule(s).

Absorption layers (or filters) according to the present disclosure preferably exhibits absorption in the visible wavelength range (about 400 to about 700 nm) and possibly also absorption in the UV-Vis wavelength range (below 400 nm) and possibly also in the IR wavelength range (above 700 nm).

Absorption layers of the present disclosure absorb in the wavelength range of visible light, preferably in the range from 400 nm to 700 nm, or a sub-range thereof, preferably 400 nm to 500 nm, or 500 nm to 600 nm, or 600 nm to 700 nm.

In one embodiment, the absorption layers of the present disclosure absorb in the blue absorption range.

In one embodiment, the absorption layers of the present disclosure absorb in the green absorption range.

In one embodiment, the absorption layers of the present disclosure absorb in the red absorption range.

Preferably, the absorption layers absorb less than 20% (more preferably less than 5%) of the maximum absorption outside of their main range of absorption, such as, at wavelengths shorter than 500 and longer than 600 nm when absorption peak is between 500 and 600 nm.

In one embodiment, the photoelectric conversion layer comprises further molecules(s), wherein in one embodiment the molecule according to the present disclosure is the donor and the further molecule is the acceptor, wherein in another embodiment the molecule according to the present disclosure is the acceptor and one further molecule is the acceptor.

The photoelectric conversion layer can comprise different components (dyes) and combinations thereof.

In one embodiment, the photoelectric conversion layer and/or the absorption layer comprises further n and p type materials (molecules) that can be used together with the thiophene and or squaraine molecules(s) of the present disclosure, such as phthalocyanine (Pc), subphthalocyanine (SubPc), merocyanine (MC), diketopyrrolopyrroles (DPP), borondipyrromethene (BODIPY), isoindigo (ID), perylene diimides (PDI), and quinacridone (QD), fused acenes, such as pentacene and tetracene and triphenylamine (TPA) as donor;

and/or fullerenes, rylene diimides, phthalocyanines and subphthalocyanines and cyanopentacenes as acceptor.

In a preferred embodiment, said photoelectric (PE) conversion layer exhibits photo response in the visible absorption range.

The PE conversion layers according to the present disclosure preferably exhibits absorption in the visible wavelength range (about 400 to about 700 nm) and possibly also absorption in the UV-Vis wavelength range (below 400 nm) and in the IR wavelength range (above 700 nm).

The PE conversion layers of the present disclosure absorb in the wavelength range of visible light, preferably in the range from 400 nm to 700 mu, or a sub-range thereof, preferably 400 nm to 500 nm, or 500 nm to 600 nm, or 600 nm to 700 nm.

In one embodiment, the PE layers of the present disclosure absorb in the blue absorption range (e.g. 400-500 nm).

In one embodiment, the molecules of the present disclosure absorb in the green absorption range (e.g. 500-600 nm).

In one embodiment, the molecules of the present disclosure absorb in the red absorption range (e.g. 600-700 nm).

Preferably, the PE layers absorb less than 20% (more preferably less than 5%) of the maximum absorption outside of their main range of absorption, such as, at wavelengths shorter than 500 and longer than 600 nm when absorption peak is between 500 and 600 nm.

As discussed above, the present disclosure provides a device, comprising molecule(s) according to the present disclosure or photoelectric conversion layer(s) according to the present disclosure.

Said device of the present disclosure can be an organic image sensor, organic photovoltaics, organic photodiode, organic light-emitting diode (OLED), organic thin-film transistor (OTFT).

As discussed above, the present disclosure provides an organic image sensor, comprising photoelectric conversion layer(s) according to the present disclosure.

The organic image sensor of the present disclosure preferably comprises (a) an organic photoconversion unit comprising photoelectric conversion layer(s) according to the present disclosure,
(b) at least one electrode,
(c) a substrate,
(d) optionally, a second electrode on top of said photoelectric conversion layer(s).

In a preferred embodiment, the organic image sensor does not comprise color filter(s).

The substrate can be silicon, quartz, glass, polymer, such as PMMA, PC, PS, COP, COP, PVA, PVP, PES, PET, PEN, mica, or combinations thereof.

The substrate can also be other photoelectric conversion unit(s) (e.g. blue 400-500 nm and red 600-500 nm conversion devices in case the organic conversion layer according to this disclosure is green 500-600 nm conversion device).

This means, a device of this disclosure can comprise (i) two inorganic units with one organic unit, (ii) one inorganic unit with two organic units, or (iii) three organic units combined with each other in the organic image sensor. Any of the organic units can contain molecules/layers/devices according to this disclosure.

In a preferred embodiment, an organic image sensor consists of three organic conversion units containing molecules in layers as of this disclosure (in devices, each with transparent electrodes), combined with each other and operating each in one of the ranges 400 nm to 500 nm, 500 nm to 600 nm and 600 nm to 700 nm.

Combined units can be realized either by vertical and/or horizontal stacking of the organic-organic or organic-inorganic units.

The electrode material can be transparent metal oxide, such as indium tin oxide (ITO), fluorine-doped indium oxide (IFO), tin oxide, fluorine-doped tin oxide (FTO), antimonium-doped tin oxide (ATO), zinc oxide (including Al, B and Ga doped zinc Oxide), indium oxide-zinc oxide (IZO), $TiO_2$, non transparent or semitransparent metal or alloy or conductive polymer, such as Au, Ag, Cr, Ni, Pd, AlSiCu, or any metal or metal alloy or metal combination with suitable workfunction; PEDOT/PSS, PANT or PANI/PSS, graphene.

As discussed above, the present disclosure provides a hybrid Silicon-organic image sensor or organic image sensor, comprising
(a) an organic photoelectric conversion unit or units comprising
  photoelectric conversion layer(s) according to the present disclosure (comprising the molecule(s) of the present disclosure),
(b) optionally, a Si based photoelectric conversion unit,
(c) metal wiring,
(d) a (CMOS) substrate,
(e) insulating layer(s), preferably oxide.

In one embodiment, said organic photoelectric conversion unit of the image sensors of the present disclosure comprises different layers within the organic based photoelectrical conversion unit(s), such as
  n-type material,
  p-type material,
  n-buffer layer,
  p-buffer layer,
or combinations and/or mixtures (e.g. n material and p material co-deposited in one layer) thereof.

For example, the organic image sensor of the present disclosure can have the structure:
  substrate/first electrode/n-buffer layer/n-material/p-material/p buffer layer/second electrode;
  substrate/first electrode/n-buffer layer/n-material/mixture of n- and p-material/p-material/p buffer layer/second electrode;
  substrate/first electrode/n-buffer layer/n-material/mixture of n- and p-material/p buffer layer/second electrode;
  substrate/first electrode/p-buffer layer/p-material/n-material/n buffer layer/second electrode.
  substrate/first electrode/p-buffer layer/p-material/mixture of n- and p-material/n-material/n buffer layer/second electrode.
  substrate/first electrode/p-buffer layer/p-material/mixture of n- and p-material/n buffer layer/second electrode.

The organic image sensor of the present disclosure can comprise different layer structures, in particular regarding the position of the n and p material with respect to the CMOS part.

The organic photoconversion unit can be used in combination with a Si based photoelectrical conversion unit where different layers absorb different color (BGR) in a hybrid silicon-organic image sensor (see FIG. 2) or can be used without Si based photoelectrical conversion unit. In this case the organic photoconversion unit has the capability of absorbing different color (BGR) (see FIG. 3).

The BGR ranges are 400-500 nm, 500-600 nm and 600-700 nm and the absorption outside of the range is preferably less than 20%, more preferably less than 10 and 5%.

As discussed above, the substrate can also be other photoelectric conversion unit(s) (e.g. blue 400-500 nm and red 600-500 nm conversion devices in case the organic conversion layer according to this disclosure is green 500-600 nm conversion device).

As discussed above, a device of this disclosure can comprise (i) two inorganic units with one organic unit, (ii) one inorganic unit with two organic units, or (iii) three organic units combined with each other in the organic image sensor. Any of the organic units can contain molecules/layers/devices according to this disclosure.

The deposition methods to produce the organic photoelectrical conversion layer are PVD, CVD, spin coating, dipping coating, casting process, inkjet printing, screen printing, spray coating, offset printing.

Different process temperatures for processing the layer are possible, namely from 150 to 245° Celsius.

As discussed above, the present disclosure provides a method for synthesis of a squaraine molecule according to the present disclosure.

Said method comprises the following step(s) (in embodiments wherein the squaraine molecule has a symmetric structure):
  Attaching the donor group to the core by reacting the appropriate reagent with squaric acid in a refluxing azeotropic water removal mixture;
or said method comprises the following step(s) (in embodiments wherein the squaraine molecule has an asymmetric structure):
  Attaching the first donor group to the core by reacting the appropriate reagent with diethyl squarate in the presence of alkylamine as catalyst, and
  After deprotecting the ester with aqueous NaOH, reacting the semiquarate precursor with the second donor molecule in a refluxing azeotropic water removal mixture.

As discussed above, the present disclosure provides a method for synthesis of a thiophene-based molecule according to the present disclosure.

Said method comprises the following step(s): dithieno thiophenes, dithienopyrroles and dithienosiloles are reacted by condensation reaction or metal catalyzed with the desired group.

Note that the present technology can also be configured as described below.

(1) A (squaraine) molecule represented by formula I

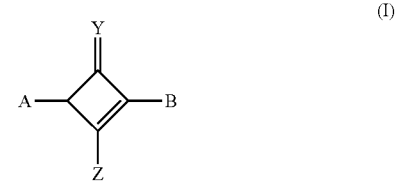

wherein

A and B are the same or different and are, at each occurrence, independently selected from

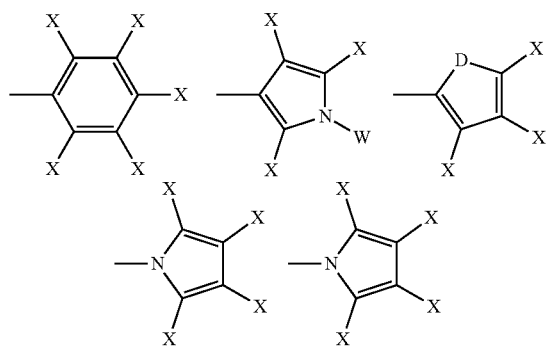

-continued

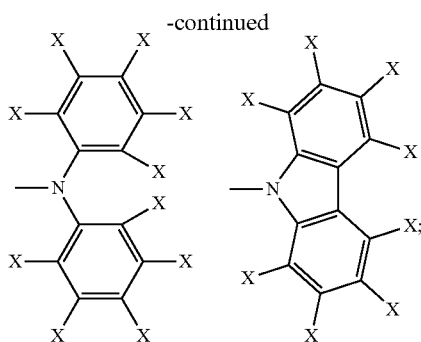

pyrazole, thiazole, imidazole, indole, quinoline, benzothiophene, benzothiazole, benzothiadiazole, benzofuran, oxazole, benzoxazole, pyridine, diazine, triazine, selenophene, naphthalene, anthracene or pyrene, any of which can optionally be substituted, optionally comprising a spacer, such as a double bond (e.g. in an embodiment, where A and/or B is indole),
D is S or O;
W is selected from H, alkyl, aryl;
X is selected from the group including H, OH, SH, $NH_2$, NHR, $NR_2$, $NO_2$, alkyl, alkoxy, aryl, aryloxy, halogen, such as F, Cl, Br, I;
Y is selected from O, S, NH, NR,

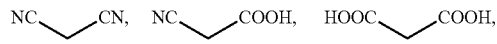

indanedione, barbituric acid or thiobarbituric acid;
Z is selected from OH, SH, $NH_2$, $NR_2$;
R, at each occurrence, is independently selected from H or any straight or branched alkyl chain of general formula $-C_nH_{2n+1}$, or $-COOR^1$, $-OR^1$, $-SR^1$, $-NR^1_2$, or F, Cl, Br, I, O, N, $NO_2$, CN, $CF_3$, wherein $R^1$ is H or any straight or branched alkyl chain of general formula $-C_nH_{2n+1}$, or any substituted or non-substituted phenyl or biphenyl, heteroaryl, n=0-12, preferably 0-6.

(2) The molecule according to embodiment (1), wherein the molecule is represented by formula Ia

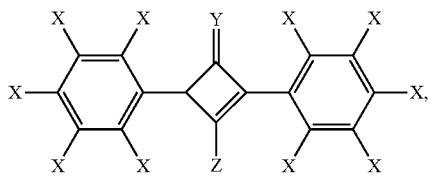

wherein X, Y and Z are as defined in embodiment (1).
(3) The molecule according to embodiment (1) represented by any of structures

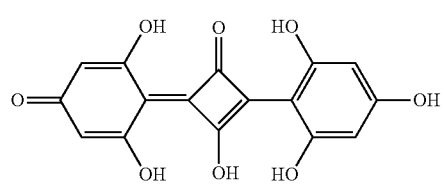

3,5-Dihydroxy-4-[2-hydroxy-4-oxo-3-(2,4,6-trihydroxy-phenyl)-cyclobut-2-enylidene]-cyclohexa-2,5-dienone -continued

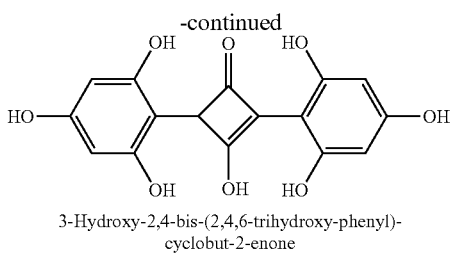

3-Hydroxy-2,4-bis-(2,4,6-trihydroxy-phenyl)-cyclobut-2-enone

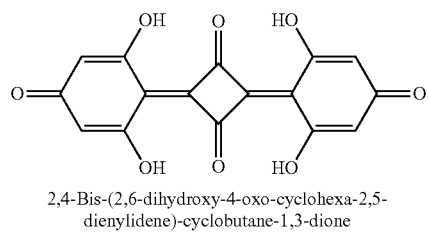

2,4-Bis-(2,6-dihydroxy-4-oxo-cyclohexa-2,5-dienylidene)-cyclobutane-1,3-dione

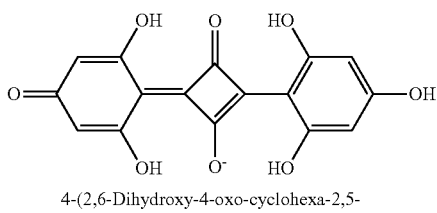

4-(2,6-Dihydroxy-4-oxo-cyclohexa-2,5-dienylidene)-3-oxo-2-(2,4,6-trihydroxy-phenyl)-cyclobut-1-enol anion

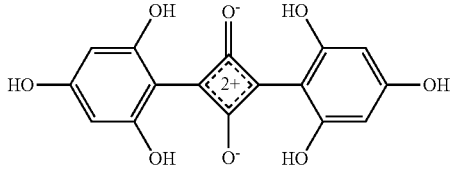

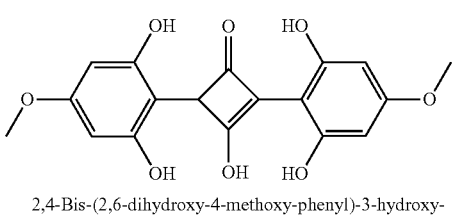

2,4-Bis-(2,6-dihydroxy-4-methoxy-phenyl)-3-hydroxy-cyclobut-2-enone

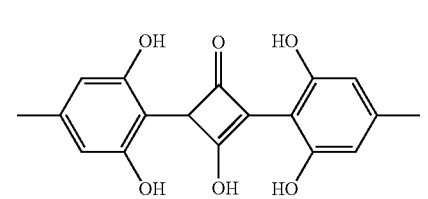

2,4-Bis-(2,6-dihydroxy-4-methyl-phenyl)-3-hydroxy-cyclobut-2-enone

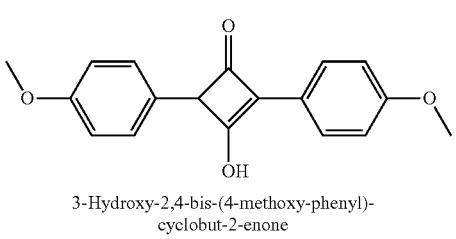

3-Hydroxy-2,4-bis-(4-methoxy-phenyl)-cyclobut-2-enone

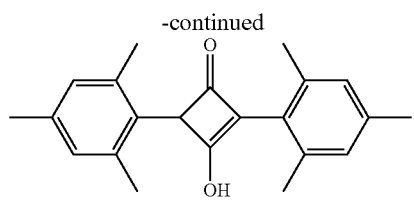

3-Hydroxy-2,4-bis-(2,4,6-trimethyl-phenyl)-cyclobut-2-enone

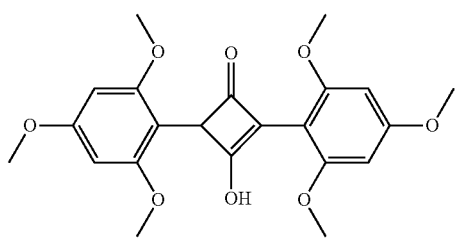

3-Hydroxy-2,4-bis-(2,4,6-trimethoxy-phenyl)-cyclobut-2-enone

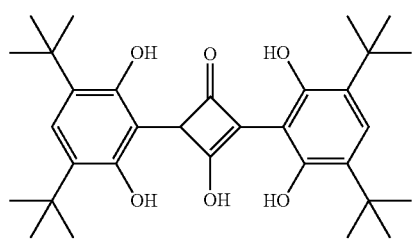

2,4-Bis-(3,5-di-tert-butyl-2,6-dihydroxy-phenyl)-3-hydroxy-cyclobut-2-enone

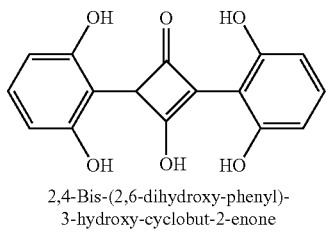

2,4-Bis-(2,6-dihydroxy-phenyl)-3-hydroxy-cyclobut-2-enone

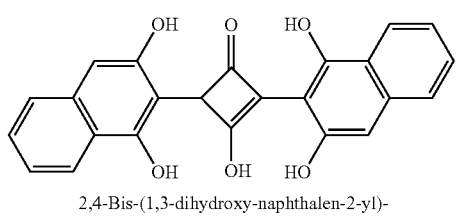

2,4-Bis-(1,3-dihydroxy-naphthalen-2-yl)-3-hydroxy-cyclobut-2-enone

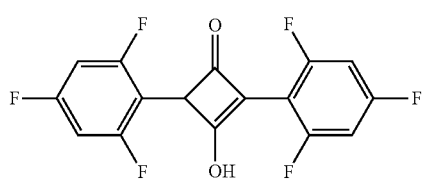

3-Hydroxy-2,4-bis-(2,4,6-trifluoro-phenyl)-cyclobut-2-enone

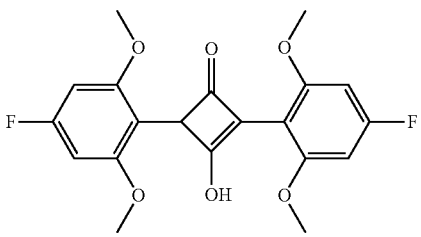

2,4-Bis-(4-fluoro-2,6-dimethoxy-phenyl)-3-hydroxy-cyclobut-2-enone

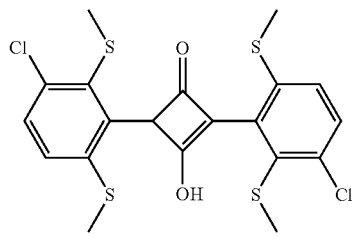

2,4-Bis-(3-chloro-2,6-bis-methylsulfanyl-phenyl)-3-hydroxy-cyclobut-2-enone

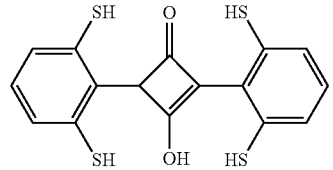

2,4-Bis-(2,6-dimercapto-phenyl)-3-hydroxy-cyclobut-2-enone

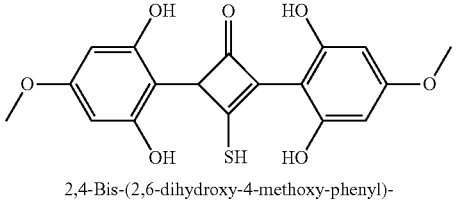

2,4-Bis-(2,6-dihydroxy-4-methoxy-phenyl)-3-mercapto-cyclobut-2-enone

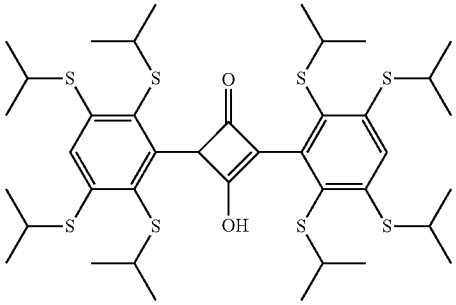

3-Hydroxy-2,4-bis-(2,3,5,6-tetrakis-isopropylsulfanyl-phenyl)-cyclobut-2-enone

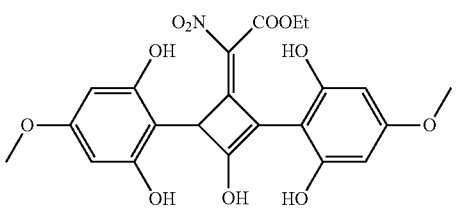

[2,4-Bis-(2,6-dihydroxy-4-methoxy-phenyl)-3-hydroxy-cyclobut-2-enylidene]-nitro-acetic acid ethyl ester -continued

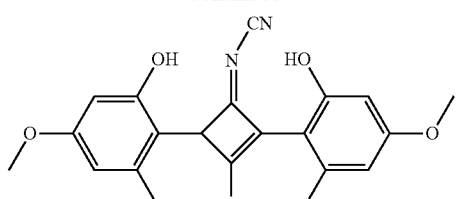

2,4-Bis-(2,6-dihydroxy-4-methoxy-phenyl)-
3-hydroxy-cyclobut-2-enylidene-cyanamide

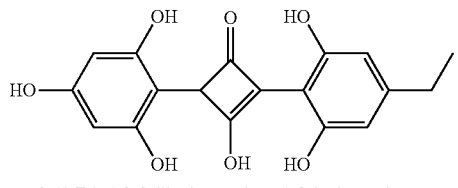

2-(4-Ethyl-2,6-dihydroxy-phenyl)-3-hydroxy-4-
(2,4,6-trihydroxy-phenyl)-cyclobut-2-enone

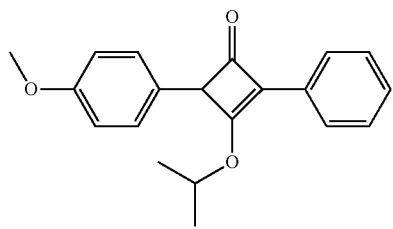

3-Isopropoxy-4-(4-methoxy-phenyl)-
2-phenyl-cyclobut-2-enone (4) The molecule according to embodiment (1), wherein the molecule is represented by any one of formula Ib

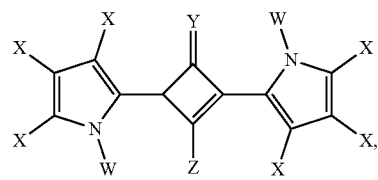

formula Ic

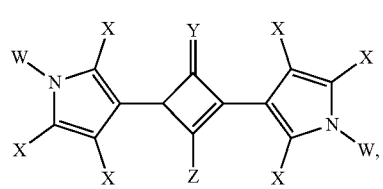

Formula Id

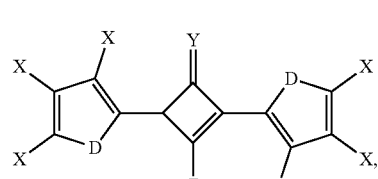

wherein D is S or O

-continued formula Ie

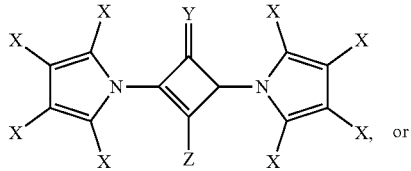

or

Formula If

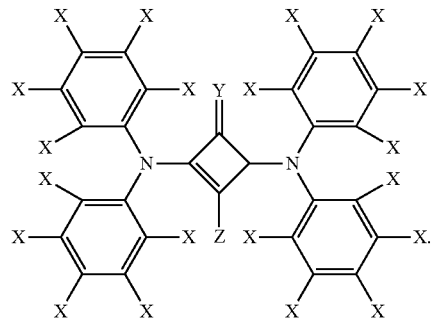

(5) The molecule according to embodiment (3) represented by any of structures

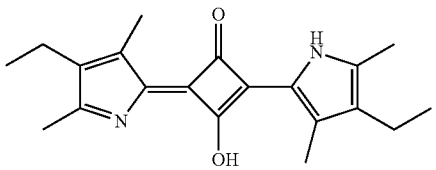

2-(4-Ethyl-3,5-dimethyl-1H-pyrrol-2-yl)-4-(4-ethyl-3,5-
dimethyl-pyrrol-2-ylidene)-3-hydroxy-cyclobut-2-enone

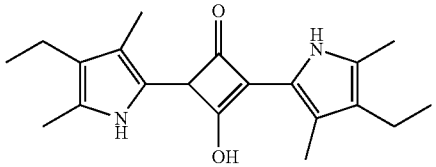

2,4-Bis-(4-ethyl-3,5-dimethyl-1H-pyrrol-2-yl)-
3-hydroxy-cyclobut-2-enone

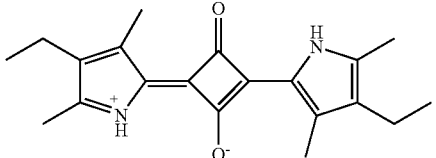

3-Oxo-2-(1,2,5-trimethyl-1H-pyrrol-3-yl)-4-(1,2,5-trimethyl-
pyrrol-3-ylidene)-cyclobut-1-enol anion

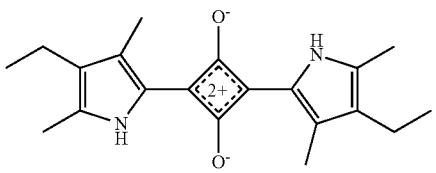

-continued

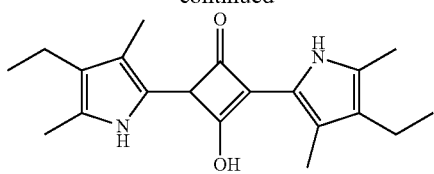

2,4-Bis-(4-ethyl-3,5-dimethyl-1 H-pyrrol-2-yl)-3-hydroxy-
cyclobut-2-enone

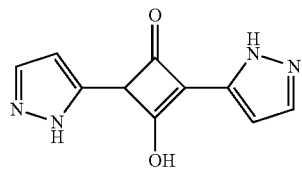

3-Hydroxy-2,4-bis-(2 H-pyrazol-3-yl)-
cyclobut-2-enone

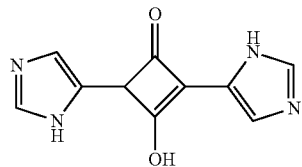

3-Hydroxy-2,4-bis-(3 H-imidazol-4-
yl)-cyclobut-2-enone

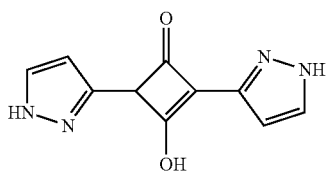

3-Hydroxy-2,4-bis-(1 H-pyrazol-3-yl)-
cyclobut-2-enone

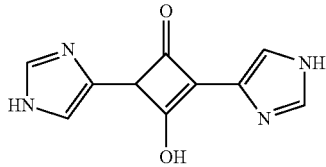

3-Hydroxy-2,4-bis-(1 H-imidazol-4-
yl)-cyclobut-2-enone

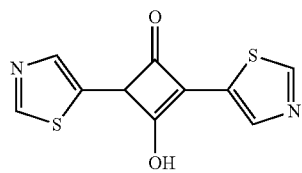

3-Hydroxy-2,4-bis-thiazol-5-
yl-cyclobut-2-enone

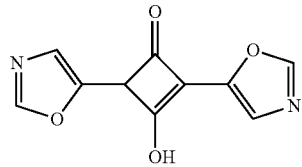

3-Hydroxy-2,4-bis-oxazol-5-
yl-cyclobut-2-enone

-continued

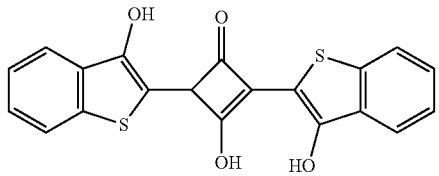

3-Hydroxy-2,4-bis-(3-hydroxy-
benzo[b]thiophen-2-yl)-cyclobut-2-
enone

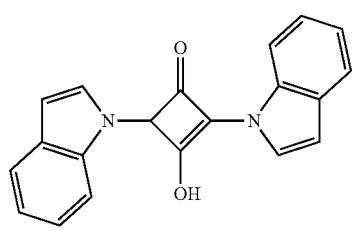

3-Hydroxy-2,4-bis-indol-1-yl-cyclobut-2-
enone

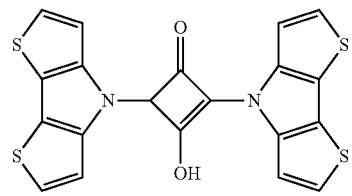

2,4-Bis-dithienol[3,2-b; 2′,3′-
d]pyrrol-4-yl-3-hydroxy-
cyclobut-2-enone (6) The molecule according to embodiment (1), wherein the molecule is represented by any one of formula Ig

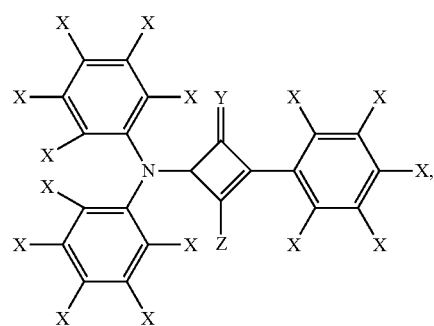

formula Ih

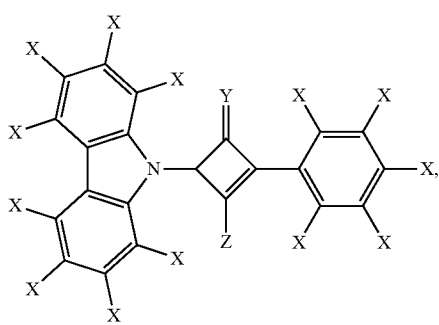

-continued

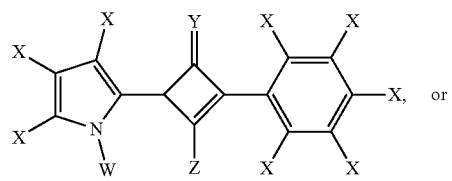

formula Ii

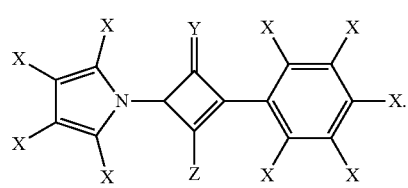

formula Ij (7) The molecule according to embodiment (6) represented by any of structures

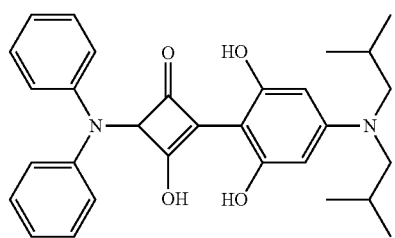

2-(4-Diisobutylamino-2,6-dihydroxy-phenyl)-4-diphenylamino-3-hydroxy-cyclobut-2-enone

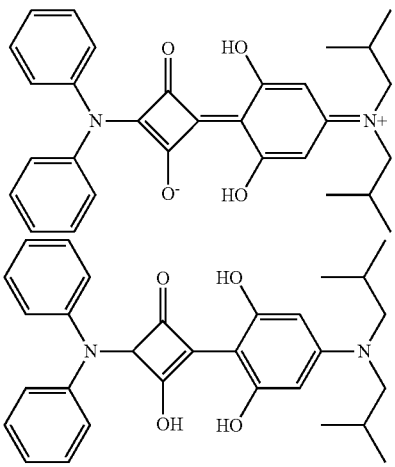

2-(4-Diisobutylamino-2,6-dihydroxy-phenyl)-4-diphenylamino-3-hydroxy-cyclobut-2-enone

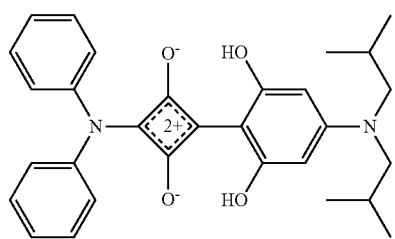

-continued

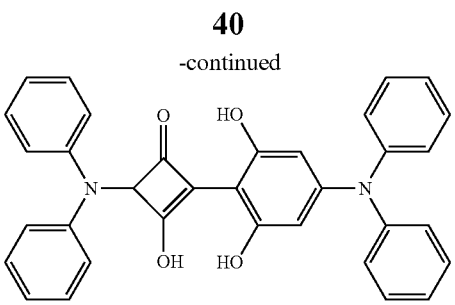

4-Diphenylamino-2-(4-diphenylamino-2,6-dihydroxy-phenyl)-3-hydroxy-cyclobut-2-enone

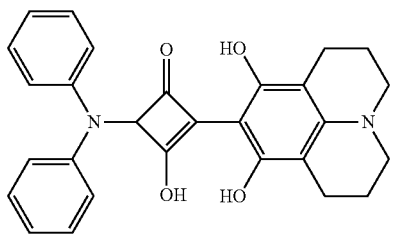

2-(8,10-Dihydroxy-2,3,6,7-tetrahydro-1H,1H-pyrido[3,2,1-ij]quinolin-9-yl)-4-diphenylamino-3-hydroxy-cyclobut-2-enone

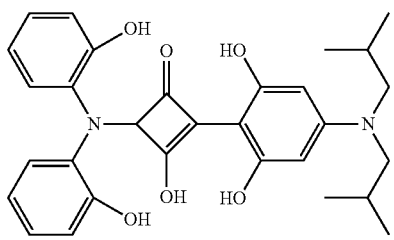

4-[Bis-(2-hydroxy-phenyl)-amino]-2-(4-diisobutylamino-2,6-dihydroxy-phenyl)-3-hydroxy-cyclobut-2-enone

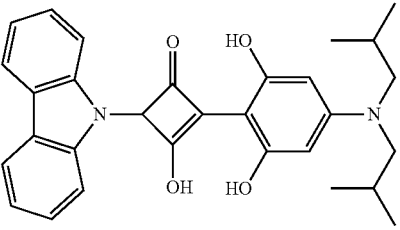

4-Carbazol-9-yl-2-(4-diisobutylamino-2,6-dihydroxy-phenyl)-3-hydroxy-cyclobut-2-enone

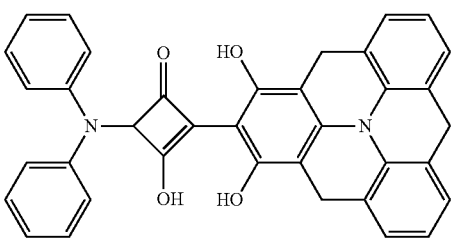

2-(1,3-Dihydroxy-4H,8H,12H-12c-aza-dibenzol[cd,mn]pyren-2-yl)-4-diphenylamino-3-hydroxy-cyclobut-2-enone

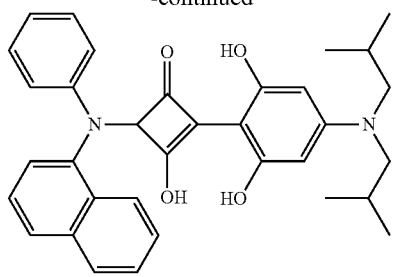

2-(4-Diisobutylamino-2,6-dihydroxy-phenyl)-
3-hydroxy-4-(naphthalen-1-yl-
phenyl-amino)-cyclobut-2-enone

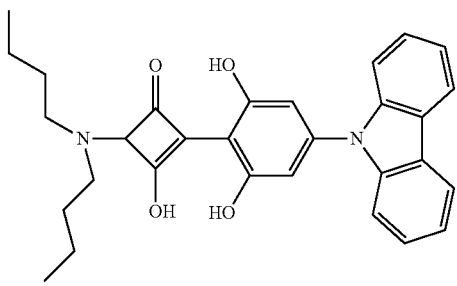

4-Dibutylamino-2-(4-diphenylamino-2,6-
dihydroxy-phenyl)-3-hydroxy-cyclobut-2-enone

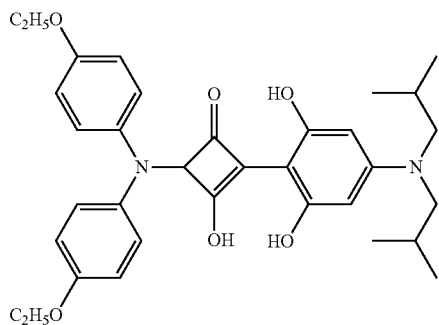

4-[Bis-(4-ethoxy-phenyl)-amino]-2-
(4-diisobutylamino-2,6-dihydroxy-phenyl)-
3-hydroxy-cyclobut-2-enone

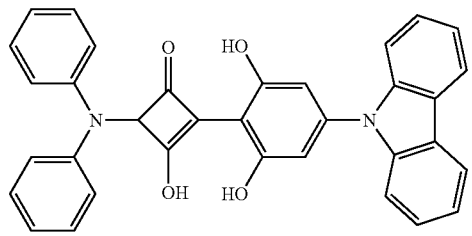

2-(4-Carbazol-9-yl-2,6-dihydroxy-phenyl)-4-diphenylamino-3-
hydroxy-cyclobut-2-enone

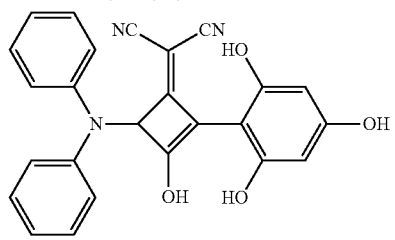

2-[4-Diphenylamino-3-hydroxy-2-
(2,4,6-trihydroxy-phenyl)-cyclobut-
2-enylidene]-malononitrile

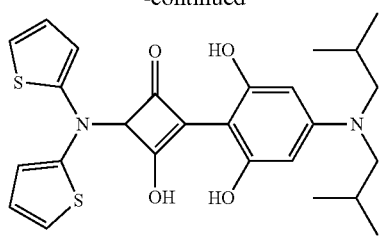

2-(4-Diisobutylamino-2,6-dihydroxy-phenyl)-
4-(di-thiophen-2-yl-amino)-3-hydroxy-cyclobut-2-enone

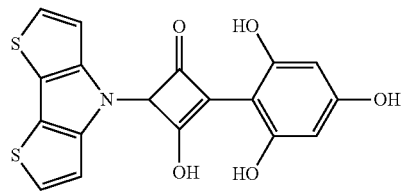

4-Dithieno[3,2-b;2',3'-d]pyrrol-4-yl-3-hydroxy-2-
(2,4,6-trihydroxy-phenyl)-cyclobut-2-enone

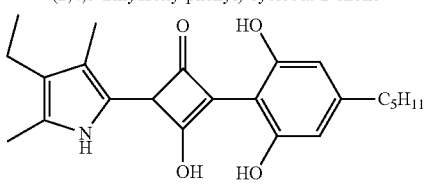

2-(2,6-Dihydroxy-4-pentyl-phenyl)-4-
(4-ethyl-3,5-dimethyl-1H-pyrrol-2-yl)-
3-hydroxy-cyclobut-2-enone

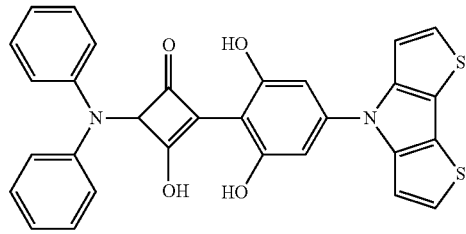

4-Diphenylamino-2-(4-dithieno[3,2-b;2,3'-d]pyrrol-4-yl-
2,6-dihydroxy-phenyl)-3-hydroxy-cyclobut-2-enone

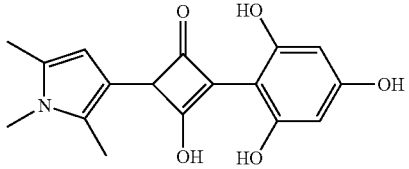

3-Hydroxy-2-(2,4,6-trihydroxy-phenyl)-4-
(1,2,5-trimethyl-1H-pyrrol-3-yl)-cyclobut-2-enone (8) The molecule according to embodiment (1) represented by any of structures

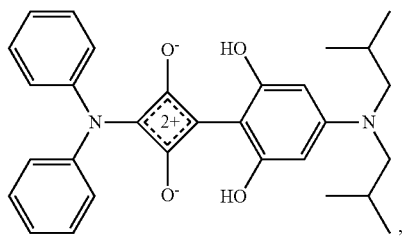
,

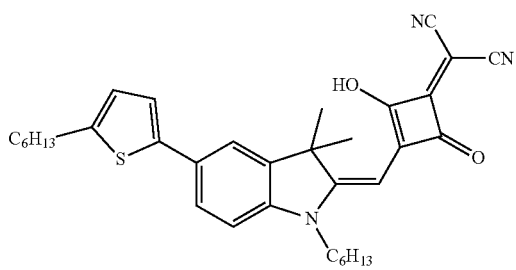

2-{3-[1-Hexyl-5-(5-hexyl-thiophen-2-yl)-3,3-dimethyl-
1,3-dihydro-indol-2-ylidenemethyl]-2-hydroxy-
4-oxo-cyclobut-2-enylidene}-malononitrile

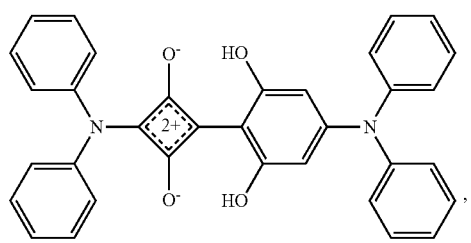

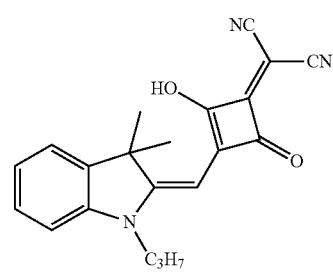

2-[3-(3,3-Dimethyl-1-propyl-1,3-dihydro-
indol-2-ylidenemethyl)-2-hydroxy-4-oxo-
cyclobut-2-enylidene]-malononitrile

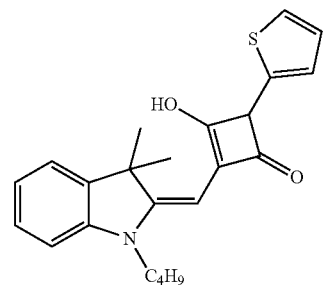

2-(1-Butyl-3,3-dimethyl-1,3-dihydro-indol-2-
ylidenemethyl)-3-hydroxy-4-thiophen-2-yl-
cyclobut-2-enone

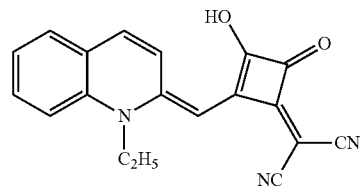

2-[2-(1-Ethyl-1H-quinolin-2-ylidenemethyl)-
3-hydroxy-4-oxo-cyclobut-
2-enylidene]-malononitrile

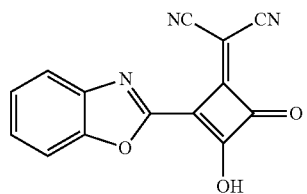

2-(2-Benzothiazol-2-yl-3-hydroxy-
4-oxo-cyclobut-2-enylidene)-malononitrile

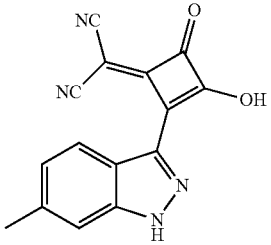

2-[3-Hydroxy-2-(6-methyl-1H-indazol-3-yl)-4-oxo-
cyclobut-2-enylidene]-malononitrile

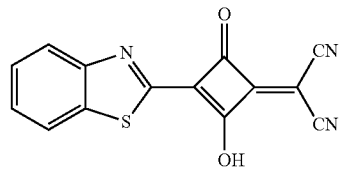

2-(3-Benzothiazol-2-yl-2-hydroxy-4-oxo-cyclobut-2-
enylidene)-malononitrile

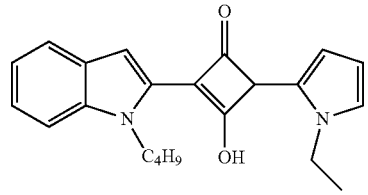

2-(1-Butyl-1H-indol-2-yl)-4-
(1-ethyl-1H-pyrrol-2-yl)-3-
hydroxy-cyclobut-2-enone

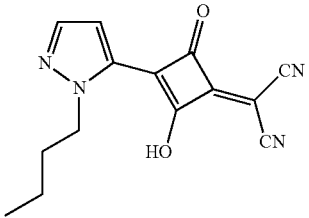

2-[3-(2-Butyl-2H-pyrazol-3-yl)-2-hydroxy-
4-oxo-cyclobut-2-enylidene]-malononitrile

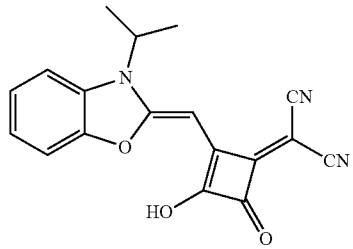

2-[3-Hydroxy-2-(3-isopropyl-3H-benzooxazol-2-
ylidenemethyl)-4-oxo-cyclobut-2-enylidene]-
malononitrile (9) A (thiophene-based) molecule represented by a formula selected from formula II, III, IV, V and VI

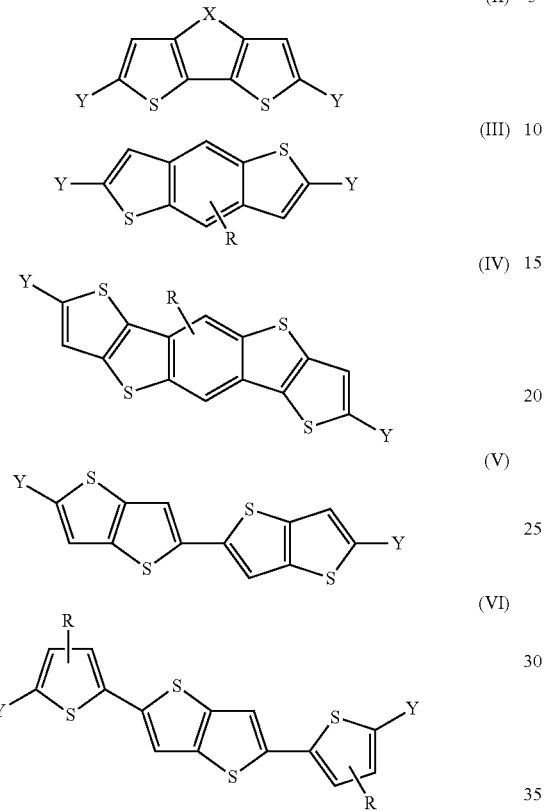

(II)
(III)
(IV)
(V)
(VI)

wherein

X is selected from the group including S, Se, N—$R^1$, $SO_2$, $CR^1_2$, cyclopentane, cyclohexane, $SiR^1_2$;

$R^1$ is selected from aryl, alkyl;

R is selected from H, aryl, substituted aryl, alkyl, thiophene, alkyl-substituted thiophene;

Y is selected from

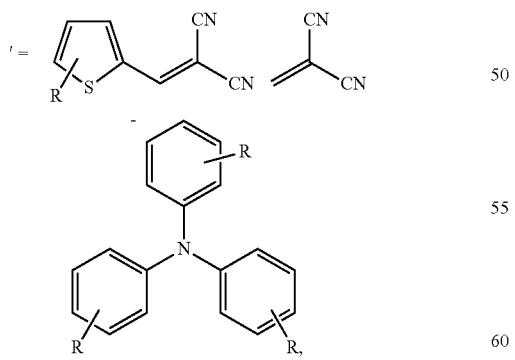

carbazole, diarylamine, pyrrole, pyrazole, thieno[3,4-b]pyrazine, imidazole, thiazole, fluorine, tricyanovinyl, indole, quinolone, benzothiadiazole, indanedione, barbituric acid or thiobarbituric acid, rhodanine, thiazolinedione derivatives as for example:

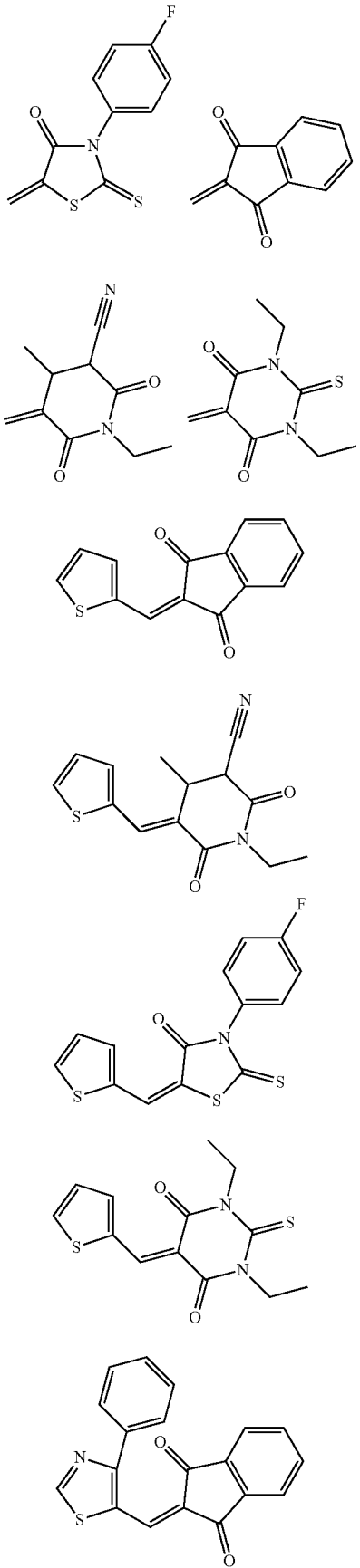

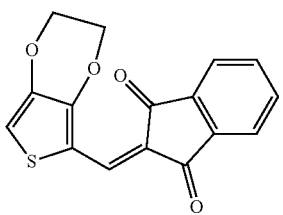

R is selected from H, aryl, substituted aryl, alkyl, thiophene, alkyl-substituted thiophene.

(10) The molecule according to embodiment (9) which is a spiro-dimer selected from

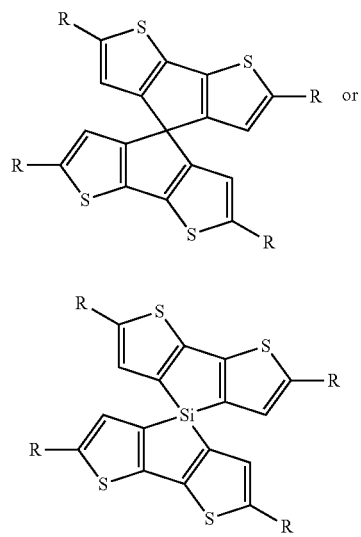

wherein R is the same as the R/as defined in embodiment (9).

(11) The molecule according to embodiment (9) represented by any of structures

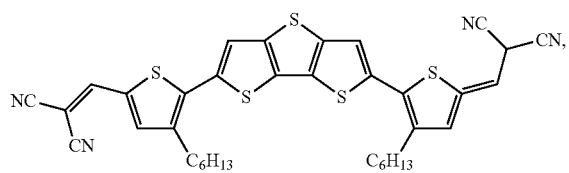

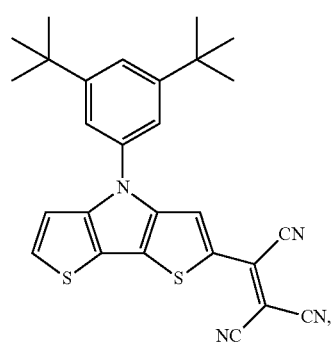

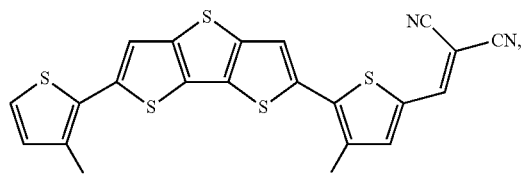

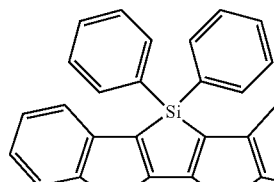

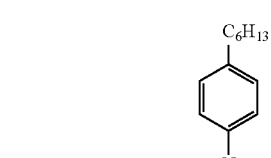

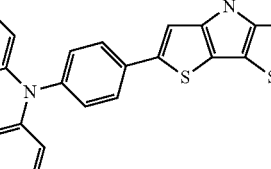

2-Cyano-3-[6-(2,2-dicyano-vinyl)-4-ethyl-4H-dithieno[3,2-b; 2′,3′-d]pyrrol-2-yl)-acrylonitrile

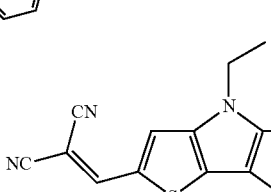

2-Cyano-3-[6-(2,2-dicyano-vinyl)-4-(2-ethyl-hexyl-4H-dithieno[3,2-b; 2′,3′-d]pyrrol-2-yl]-acrylonitrile

3-[4-Benzyl-6-(2,2-dicyano-vinyl)-4H-dithieno[3,2-b; 2′,3′-d]pyrrol-2-yl]-2-cyano-acrrylonitrile

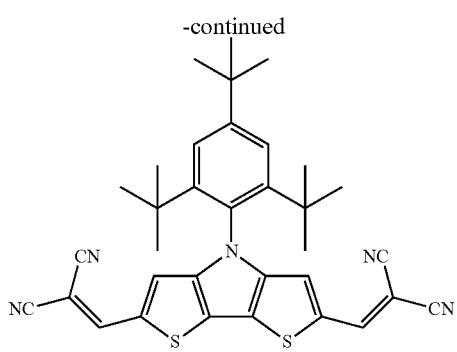

2-Cyano-3-[6-(2,2-dicyano-vinyl)-4-(2,4,6-tri-tert-butyl-phenyl)-4H-dithienol[3,2-b;2',3'-d[pyrrol-2-yl)-acrylonitrile

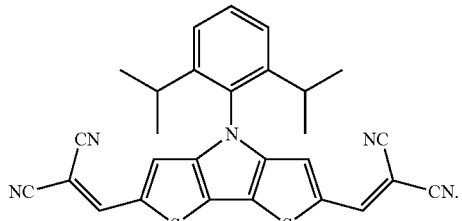

2-Cyano-3-(6-(2,2-dicyano-vinyl)-4-(2,6-diisopropyl-phenyl)-4H-dithienol[3,2-b;2',3'-d[pyrrol-2-yl)-acrylonitrile

(12) The molecule according to any one of embodiments (1) to (8), wherein the molecule
exhibits absorption in the visible wavelength range (about 400 to about 700 nm) and exhibits no absorption in the IR range (above 700 nm).

(13) The molecule according to any one of embodiments (9) to (11), wherein the molecule
exhibits absorption in the visible wavelength range (about 400 to about 700 nm) and
optionally, exhibits also absorption in the IR range (above 700 nm)

(14) The molecule according to any one of embodiments (1) to (13), wherein furthermore the molecule
absorbs in the blue absorption range or absorbs in the green absorption range or absorbs in the red absorption range,
preferably shows an extinction coefficient of $>10^4 L mol^{-1} cm^{-1}$,
absorbs less than 20% (more preferably less than 5%) of the maximum absorption outside of its main range of absorption.
and/or
exhibits a high photoelectric conversion efficiency of more than 15%, preferably of more than 50% and more preferably more than 80%.

(15) Use of a molecule according to any of embodiments (1) to (14) in an absorption layer, wherein the molecule preferably exhibits absorption in the visible wavelength range (about 400 to about 700 nm) and, optionally, exhibits also absorption in the IR range (above 700 nm).

(16) Use of a molecule according to any one of embodiments (1) to (14) in a filter, wherein the molecule preferably exhibits absorption in the visible wavelength range (about 400 to about 700 nm) and, optionally, exhibits also absorption in the IR range (above 700 nm).

(17) Use of a molecule according to any one of embodiments (1) to (14) in a photoelectric conversion layer and/or in an organic and/or hybrid module for optoelectronic application, such as image sensor, photodiode, organic photovoltaics, including organic photoelectric conversion layer(s), OLED and OTFT organic modules.

(18) A photoelectric conversion layer including a molecule according to any one of embodiments (1) to (14), optionally including further molecule(s).

(19) An absorption layer including a molecule according to any one of embodiments (1) to (14),
optionally including further molecule(s),
wherein the molecule preferably exhibits absorption in the visible wavelength range (about 400 to about 700 nm) and, optionally, exhibits also absorption in the IR range (above 700 nm).

(20) A filter including a molecule according to any one of embodiments (1) to (14), optionally including further molecule(s),
wherein the molecule preferably exhibits absorption in the visible wavelength range (about 400 to about 700 nm) and, optionally, exhibits also absorption in the IR range (above 700 nm).

(21) A device, including molecule(s) according to any one of embodiments (1) to (14) or photoelectric conversion layer(s) according to embodiment (18),
wherein said device is preferably an organic image sensor, an hybrid image sensor, photodiode, organic photovoltaics, organic light-emitting diode (OLED), organic thin-film transistor (OTFT).

(22) The device according to embodiment (21), wherein said photoelectric conversion layer exhibits photo response in the visible absorption range.

(23) The device according embodiment (21) or (22), including molecule(s) according to any one of embodiments (1) to (14) or photoelectric conversion layer(s) according to embodiment (18),
and/or including further molecule(s).

(24) An organic image sensor, including
(a) an organic photoelectric conversion unit including photoelectric conversion layer(s) according to embodiment (18),
(b) at least one electrode,
(c) a substrate,
(d) optionally, a second electrode on top of said photoelectric conversion layer(s), preferably not including color filter(s).

(25) A hybrid Silicon-organic image sensor or organic image sensor, including
(a) an organic photoelectric conversion unit or units including photoelectric conversion layer(s) according to embodiment (18),
(b) optionally, a Si based photoelectric conversion unit,
(c) metal wiring,
(d) a (CMOS) substrate,
(e) insulating layer(s), preferably oxide.

(26) The organic image sensor according to embodiment (24) or embodiment (25), wherein said organic photoelectric conversion unit includes different layers,
such as n-type material, p-type material, n-buffer layer and/or p-buffer layer or combinations or mixtures thereof.

(27) A method for synthesis of a molecule according to any one of embodiments (1) to (8), including the following step(s):
Attaching the donor group to the core by reacting the appropriate reagent with squaric acid in a refluxing azeotropic water removal mixture,
or including the following step(s):
Attaching the first donor group to the core by reacting the appropriate reagent with diethyl squarate in the presence of alkylamine as catalyst, and
After deprotecting the ester with aqueous NaOH, reacting the semiquarate precursor with the second donor molecule in a refluxing azeotropic water removal mixture.

(28) A method for synthesis of a molecule according to any one of embodiments (9) to (11), including the following step(s):

Reacting dithieno thiophenes, dithienopyrroles and dithienosiloles by condensation reaction or metal catalyzing with the desired group.

The term "squaraine molecule" or "squaraine-based molecule", as used herein, refers to a molecule having one or several aromatic ring systems attached to a squaraine core, which aromatic ring systems, if there are several such ring systems, may be identical (symmetric dye) or different (asymmetric dye).

The term "thiophene molecule" or "thiophene-based molecule", as used herein, refers to a molecule having at least two thiophene molecules directly connected to each other, and the term "spiro-thiophene molecule", as used herein, refers to a molecule having at least three condensate ring in which at least two are thiophene rings The term "absorption in the visible wavelength range" or "dye exhibiting absorption in the visible wavelength range", as used herein, is meant to refer to a molecule/dye that is able to absorb light in only one or several parts of the entire range indicated or over the total range. For example a molecule may only absorb in the range of from 500-700 nm, whereas another molecule may absorb in the range of from 400-700 nm or 500-600 nm, whereas a third molecule may absorb over the range of from 400-500 nm (or the above described sub-ranges of preferably 400 nm to 500 nm, or 500 nm to 600 nm, or 600 nm to 700 nm). All these scenarios are meant to be encompassed by such wording.

The term "no absorption in the IR range" or "dye exhibiting no absorption in the IR range", as used herein, is meant to refer to a molecule/dye that is able to absorb light in wavelength ranges until but not above 700 nm.

The term "narrow absorption band", as used herein, is meant to refer to/means that the width of the absorption band at 0 intensity is 200 nm, more preferably 150 nm, more preferably 100 nm.

The term "intense absorption band", as used herein, is meant to refer to/means that the extinction coefficients $\varepsilon > 10^4 Lmol^-cm^{-1}$.

In accordance with the present disclosure, the term "electrode" refers to an electrical lead to apply voltage. An electrode may be "interdigitated", meaning that it has a comb-like shape with two combs lying opposite each other and the respective figures of the combs engaging with each other. Alternatively, an electrode may be a non-interdigitated. An electrode may be transparent or non-transparent. A transparent electrode may, for example, be formed from indium tin oxide (ITO) or from fluorinated tin oxide (FTO). A non-transparent electrode may be reflective and may, for example, be formed from silver (Ag) or gold (Au).

The requirements of a photoelectric conversion layer to be used in image sensors are demanding and can be summarised as followed:
  (i) narrow absorption band;
  (ii) high extinction coefficient, $\varepsilon > 10^4 Lmol^{-l}cm^{-1}$ (for high sensitivity in thin film);
  (iii) heat resistant;
  (iv) high photoelectric conversion efficiency (EQE);
  (v) high-speed responsivity/high charge carrier mobility;
  (vi) low dark-current in device;
  (vii) thin film by thermal vapour deposition (Tvp<Tdec).

The present inventors have found novel squaraines and thiophene based dyes/molecules which are highly suitable as active materials for organic photoelectric conversion layers with improved conversion efficiency and response speed in organic photodiodes for vertically-integrated (VI) CMOS image sensors application. The advantages of those materials with respect to the requirements, the different type of possible molecular structures and example of molecules for use as photoelectrical conversion layer are reported herein.

The present disclosure relates to squaraine dyes/molecules and thiophene base dyes/molecules with specific molecular formulas that absorb in the visible range (400-700 nm) and their use as active materials for use in bulk heterojunction or PN or PiN junction as photoelectric conversion layer.

The squaraine dyes/molecules of the present disclosure can be used as active materials for the organic photoconversion unit.

The organic photoconversion unit can be used in combination with a Si based photoelectrical conversion unit where different layer absorbed different colour (BGR) in a hybrid Silicon-organic image sensor or can be used without Si based photoelectrical conversion unit. In this case the organic photoconversion unit having the capability of absorbing different colour (BGR).

Figure 2:
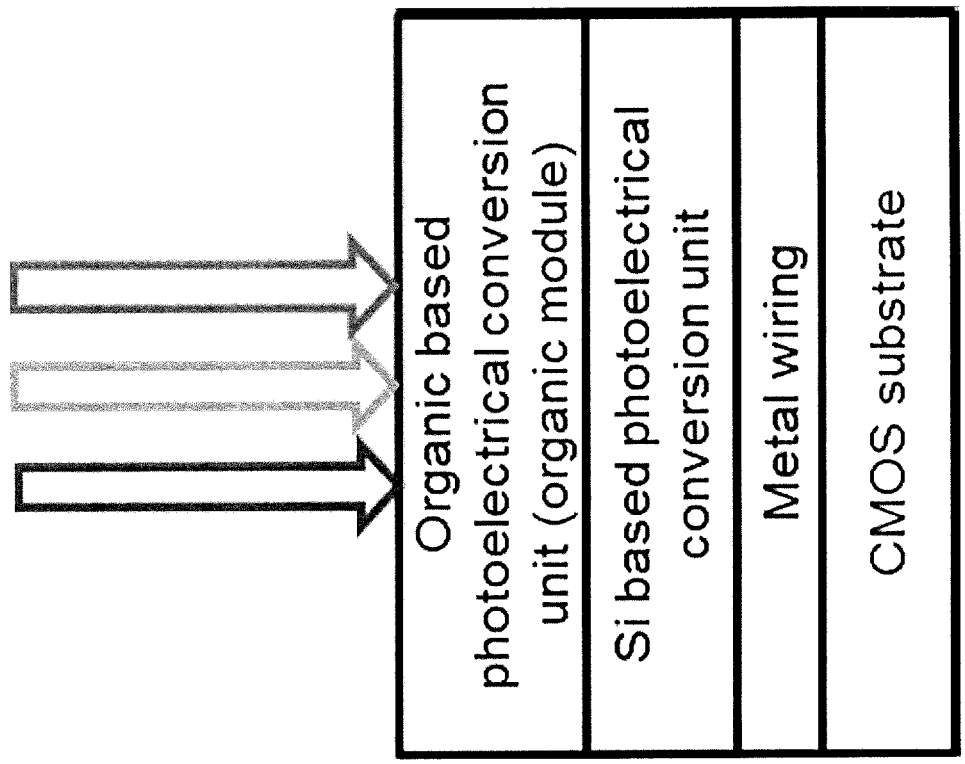
FIG. 2 shows a schematic representation of the hybrid silicon-organic image sensor.
Figure 3:
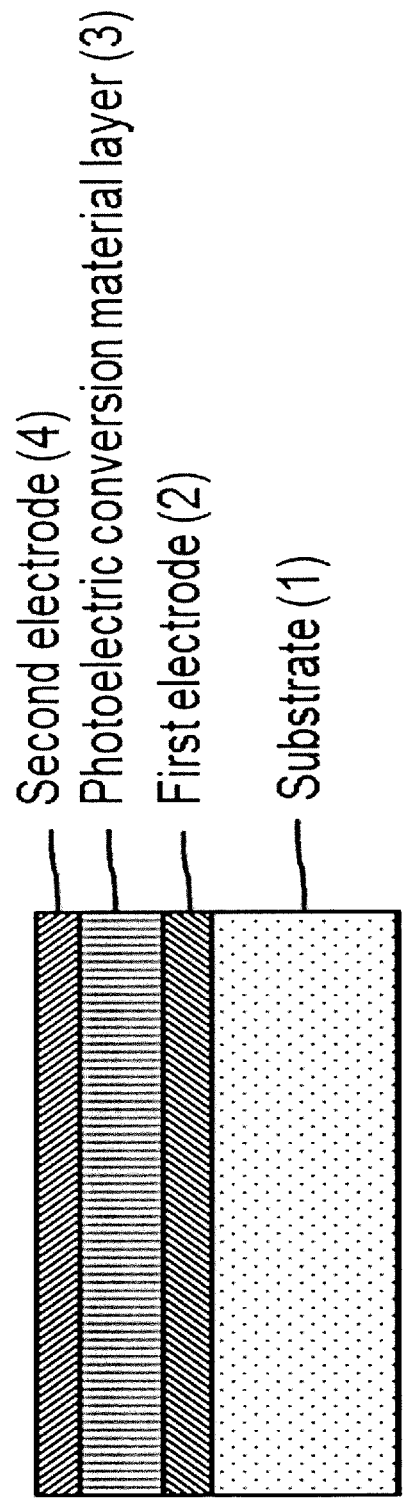
FIG. 3 shows a schematic representation of the organic based photoelectrical conversion unit with the different layers.

The general structure of the resulting hybrid image sensor device as well as the details of the organic based photoelectrical conversion unit are schematic represented in the FIGS. 2 and 3.

The squaraine dyes/molecules of the present disclosure have a donor-acceptor-donor structure, wherein A and B are donor group (electron donating groups), while the central part (squaraine core) is the acceptor part (electron withdrawing group).

The main advantages of the squaraine dyes/molecules of the present disclosure for the application in photoelectrical conversion layers are as follows:
  (1) narrow and intense absorption bands (extinction coefficient $\varepsilon > 10^5 Lmol^{-1}cm^{-1}$);
  (2) high photoelectric conversion efficiencies (xerographic applications);
  (3) processability already proven for organic photovoltaics (OPV), photodetectors and organic imager as IR absorber (absorption >700 nm) (for this dye type)

The absorption and energy levels of the squaraine dyes/molecules of the present disclosure are tunable by the type of donor attached to the squaric acid/squaraine core. Moreover, squaraine dyes are known to form aggregates in thin films that cause a broadening of the absorption peak. The molecular packing and the morphology of the solid state thin film can be tuned varying the substituent groups X in the donor moieties A and B. This makes the squaraine dyes/molecules of the present disclosure a very versatile dye/molecule to be used in the organic photoelectric conversion layer.

The main advantages of the thiophene-based dyes/molecules of the present disclosure for the application in photoelectrical conversion layer are as follow:
  (1) absorption range in the required wavelength range with intense absorption bands (extinction coefficient $\varepsilon > 10^4 Lmol^{-1} cm^{-1}$);
  (2) excellent charge transport properties;
  (3) thermally stable, thermal vapour deposition possible;
  (4) processability already proven for application in organic photovoltaics (OPV) (for this dye type).

The absorption, energy levels and morphology of the thiophene-based dyes/molecules of the present disclosure can be tuned by molecular structure variation. The spiro-unit narrows the absorption band width by reducing the degree of vibrational freedom in the thiophene conjugated chain.

In specific embodiments, different molecular dye/molecule structures, different components and combination of the photoelectric conversion layer (list of possible electrodes, list of other possible n and p type materials that could be used together with the thiophene and or squaraine, list of different n and p type buffer layer), different layer structures (position of the n and p material with respect to the electrodes) and different process temperature for processing the layer (from 150 to 245° Celsius) are described herein.

The dyes/molecules of the present disclosure and their use in photoelectric conversion layers have the following advantages:
(1) no color filter(s) is/are needed and therefore no moiré and shading;
(2) no color filter(s) is/are needed and therefore higher brightness;
(3) less process steps and therefore cost reduction;
(4) high color reproducibility (less false color);
(5) high sensitivity and pixel resolution;
(6) new IP and therefore less cost reduction;
(7) dyes with high extinction coefficient—less material needed.

EXAMPLES

Example 1

Squaraine Molecule

The inventors used a specific asymmetrical N,N-diarylanilino squarylium molecule (DAASQ) (SQ3) as n-type material, green absorer as part of the organic photoelectric conversion unit.

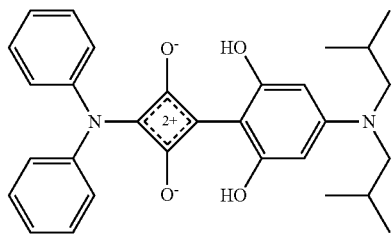

Figure 4:
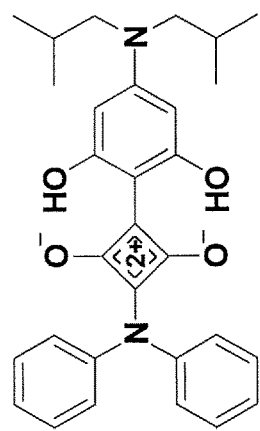
FIG. 4 shows the squaraine molecule of Example 1 and its absorption in solution (left) and in the solid state (right).
Figure 4:
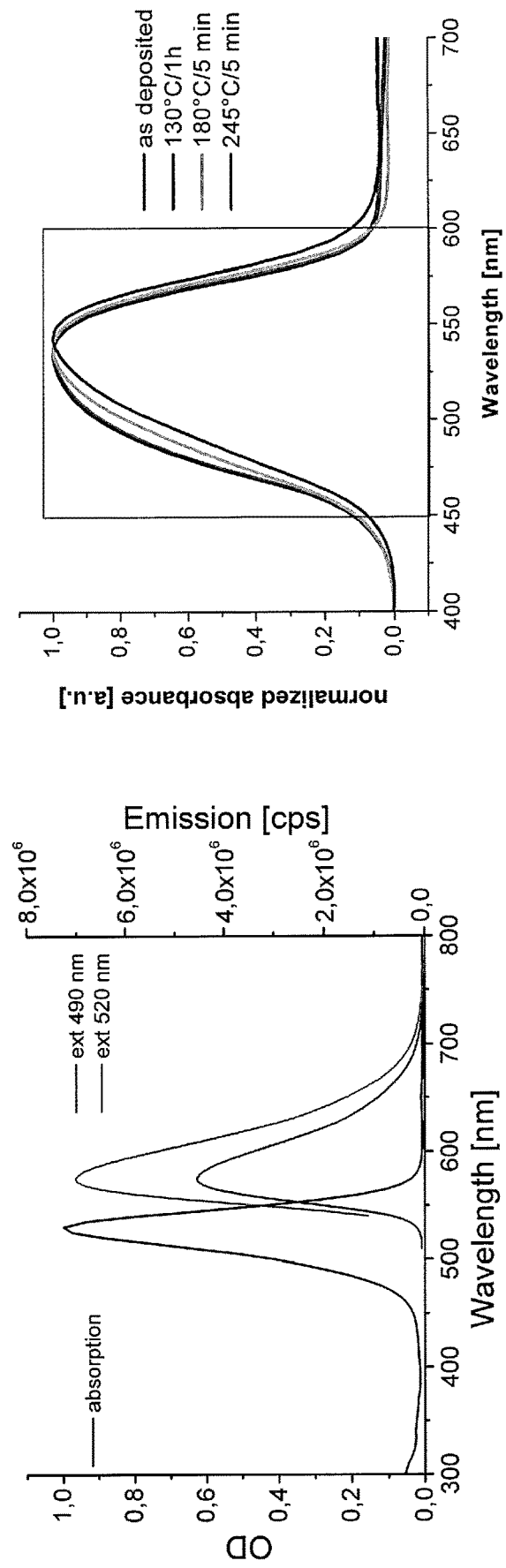

The absorption of the molecule in solution and in the solid state fits perfectly with the requirements (see FIG. 4).

Furthermore, no broadening of the absorption peak occurred even after annealing at higher temperature (130° C. for 1 h, 180° C. for 5 min, 245° C. for 5 min), often needed during the processing of the image sensor device.

The thermal properties are also in line with the requirements, s T evaporation=210° C. (3*10-7 mbar)<T decomposition=310° C.

Figure 5:
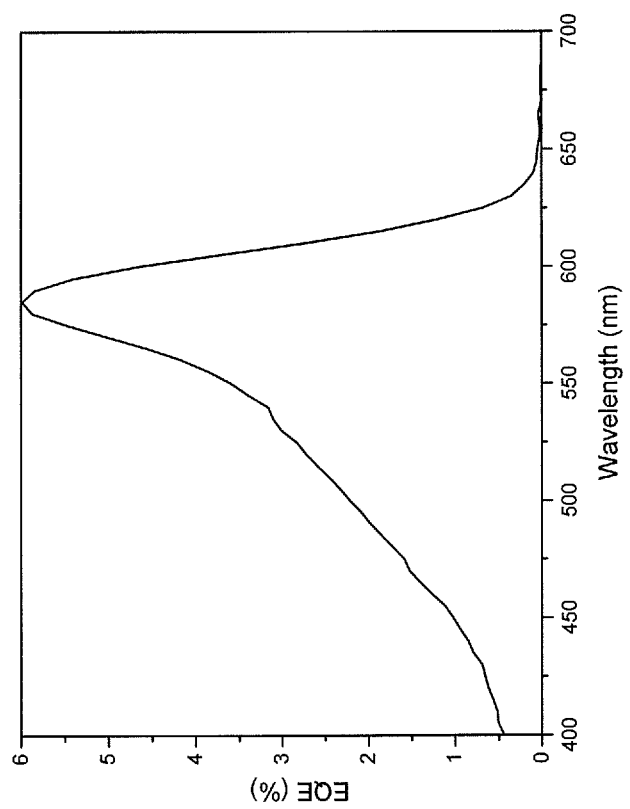
FIG. 5 shows the External Quantum Efficiency (EQE) of a photoelectric conversion layer wherein the squaraine molecule of Example 1 was used as donor material in combination with subphthalocyanine fluoride as acceptor.

The squaraine molecule SQ3 was used as donor material in combination with subphthalocyanine fluoride (SubPcF) as acceptor in the following configuration: ITO/SQ3 30 nm/SubPcF 30 nm/BPhen 3.5 nm/AlSiCu 100 nm/LiF 100 nm. The layer gave an External Quantum Efficiency (EQE) of 5.6% at 585 nm and at 0V (FIG. 5).

Example 2

Thiophene Molecule

The inventors used of a specific Spiro thiophene derivative (Spiro-4T) as p-type material, green absorer as part of the photoelectric conversion layer in an organic image sensor module.

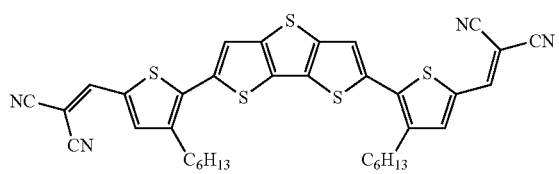

Figure 6:
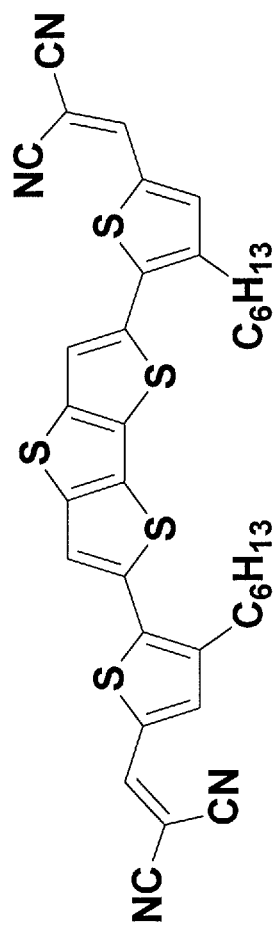
FIG. 6 shows the thiophene-based molecule of Example 2 and its absorption in solution (left) and in the solid state (right).
Figure 6:
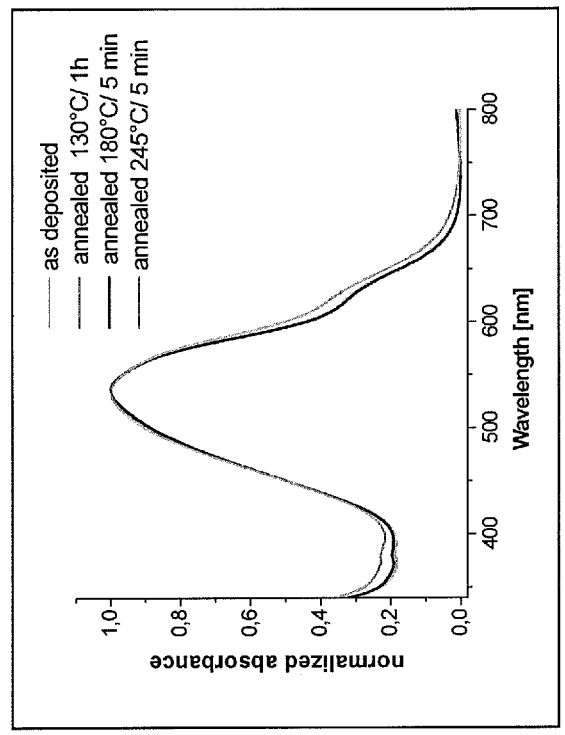
Figure 6:
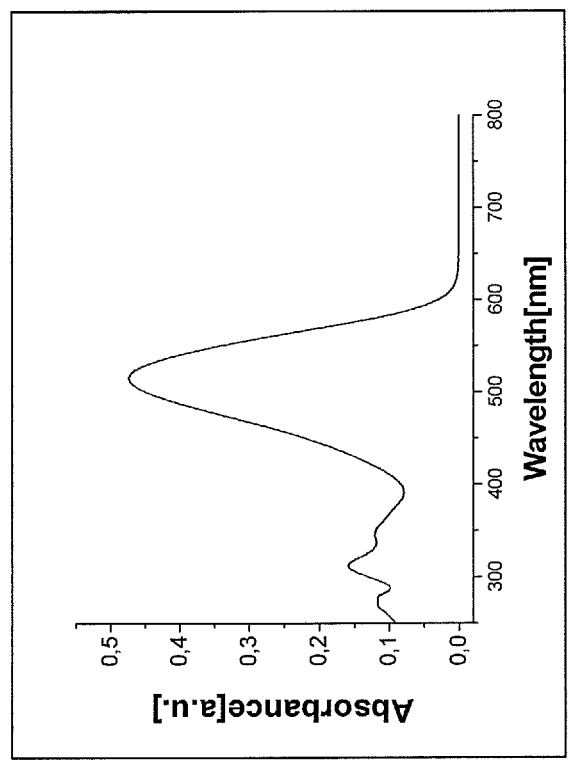

The absorption of the molecule in solution and in the solid state fits perfectly with the requirements (see FIG. 6).

The absorption in thin film stays constant even after annealing at higher temperature (130° C. for 1 h, 180° C. for 5 min, 245° C. for 5 min), often needed during the processing of the image sensor device.

The thermal properties are also in line with the requirements T evaporation=210° C. (3*10-7 mbar)<T decomposition=350° C.

The thiophene derivate Spiro-4T was used as donor material in combination with subphthalocyanine chloride (SubPc-Cl) as acceptor in the following configuration: ITO/10 nm Spiro-4T/Spiro-4T &SubPc-Cl120 nm/10 nm SubPc-Cl/AlSiCu 100 nm/LiF 100 nm. The device gave an EQE (535 nm LED) of 0.5% at 0V and 2% at −1V.

Example 3

Squaraine Molecule

A further squaraine derivative was used, called 4-Diphenylamino-2-(4-diphenylamino-2,6-dihydroxy-phenyl)-3-hydroxy-cyclobut-2-enone (SQ8).

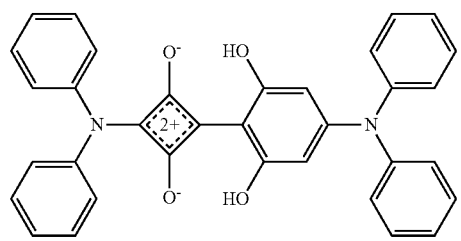

Figure 7:
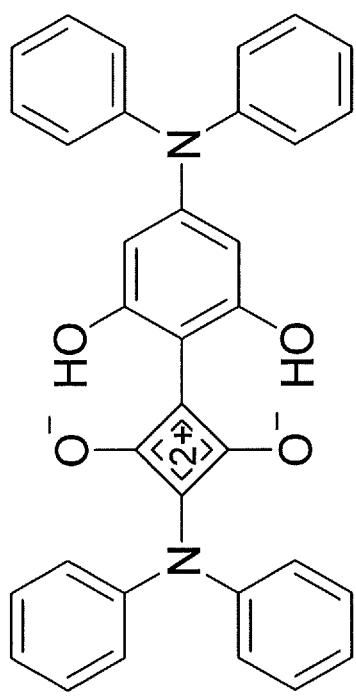
FIG. 7 shows the squaraine molecule of Example 3 and its absorption in solution (left) and in the solid state (right).
Figure 7:
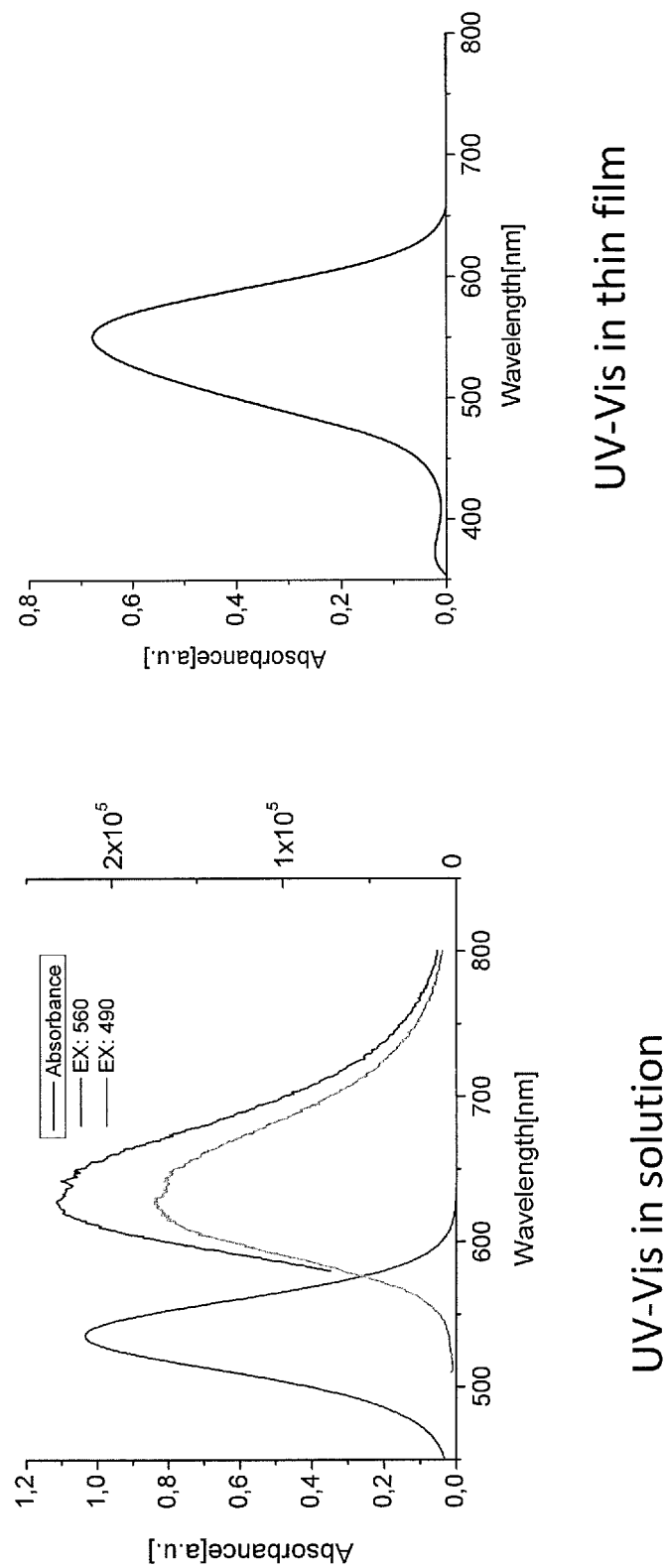

The absorption of the dye in solution and in the solid state fits perfectly with the requirements (see FIG. 7).

Figure 8:
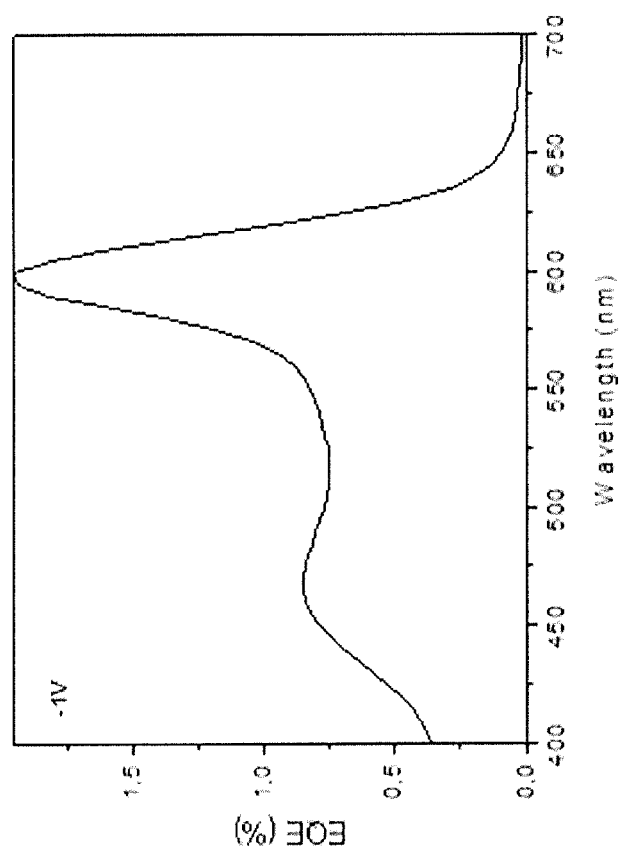
FIG. 8 shows the External Quantum Efficiency (EQE) of a photoelectric conversion layer wherein the squaraine molecule of Example 3 was used as donor material in combination with subphthalocyanine chloride as acceptor.

The squaraine SQ8 was used as donor material in combination with subphthalocyanine chloride (SubPc-Cl) as acceptor in the following configuration: ITO/SQ8 50 nm/SubPc-Cl 50 nm/NBPhen 3.5 nm/AlSiCu 100 nm/LiF 100 nm. The device showed and EQE of 0.7% at 0V and 2% at −1V (FIG. 8).

Example 4

Thiophene Molecule

A further thiophene molecule derivative was used, called N-(di-tert-butylphenyl)-(tricyanovinyl)-dithienopyrrole (DTP3)

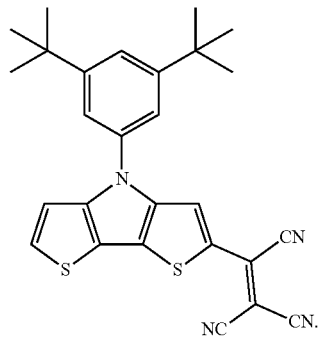 [SMILES: CC(C)(C)c1cc(-n2c3ccsc3c3sc(C(C#N)=C(C#N)C#N)cc32)cc(C(C)(C)C)c1]

Figure 9:
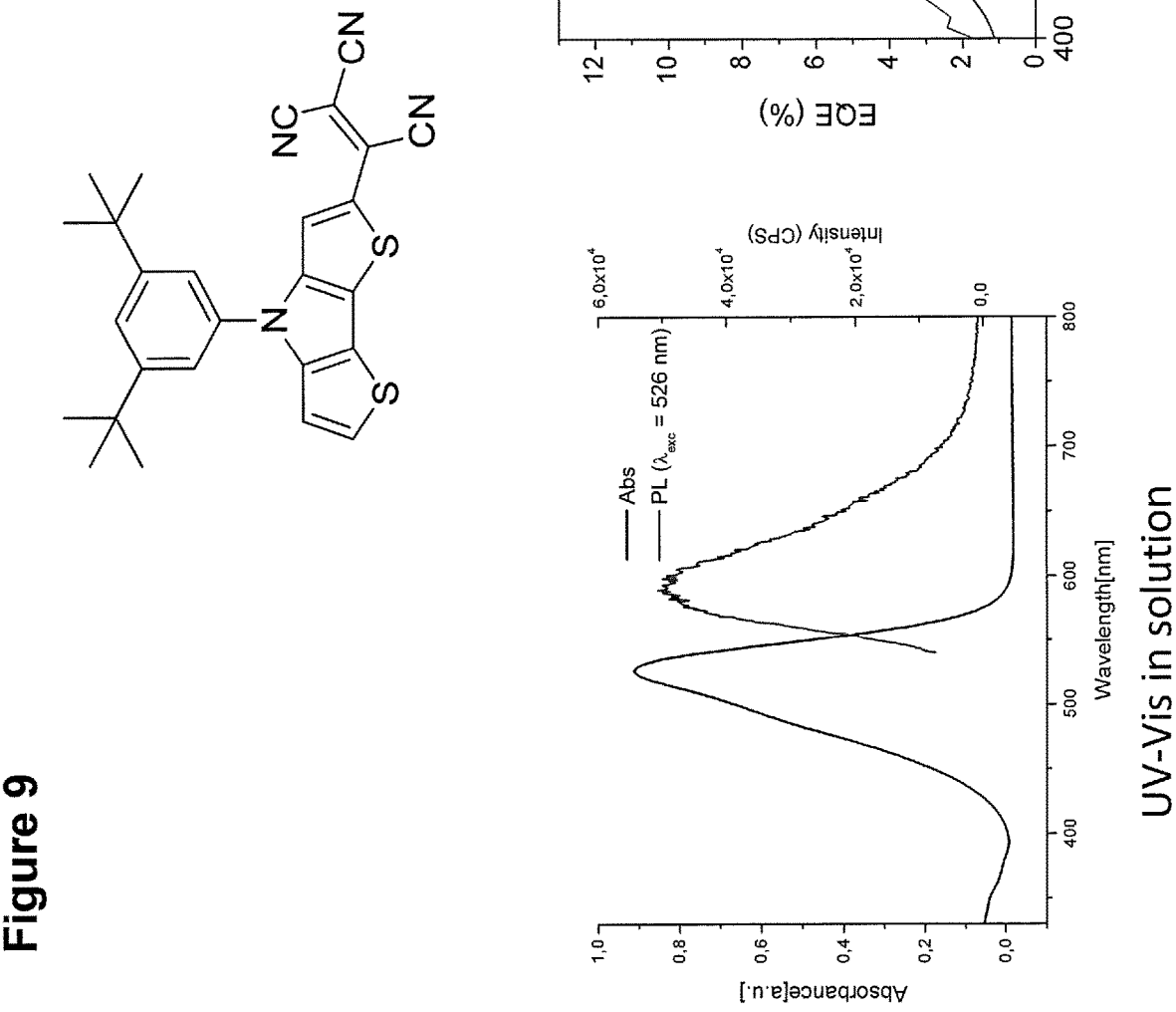
FIG. 9 shows the thiophene-based molecule of Example 4 and its absorption in solution (left); and the External Quantum Efficiency (EQE) of a photoelectric conversion layer wherein the thiophene molecule of Example 4 was used as donor material in combination with subphthalocyanine chloride as acceptor (right).

The absorption of the molecule in solution fits with the requirements (see FIG. 9).

The thiophene molecule derivative was used as donor material in combination with subphthalocyanine chloride (SubPc-Cl) as acceptor in the following configuration: ITO/5 nm MoO3/5 nm HG01/10 nm DTP-3/100 nm DTP-3 &SubPc-Cl/10 nm SubPc-Cl/3.5 nm NBPhen/100 nm AlSiCu/100 nm LiF. The device showed and EQE of 6% at 0V and 12% at −1V (FIG. 9).

Example 5

Thiophene Molecule

A further thiophene molecule derivative was used, called N-(di-tert-butylphenyl)-dithienopyrrole-thiophene indandione (DTP6)

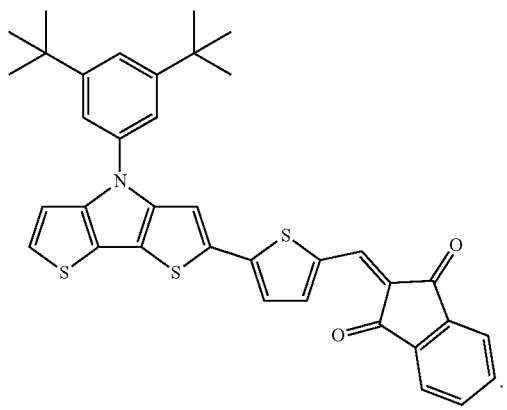 [SMILES: CC(C)(C)c1cc(-n2c3ccsc3c3sc(-c4ccc(C=C5C(=O)c6ccccc6C5=O)s4)cc32)cc(C(C)(C)C)c1]

Figure 10:
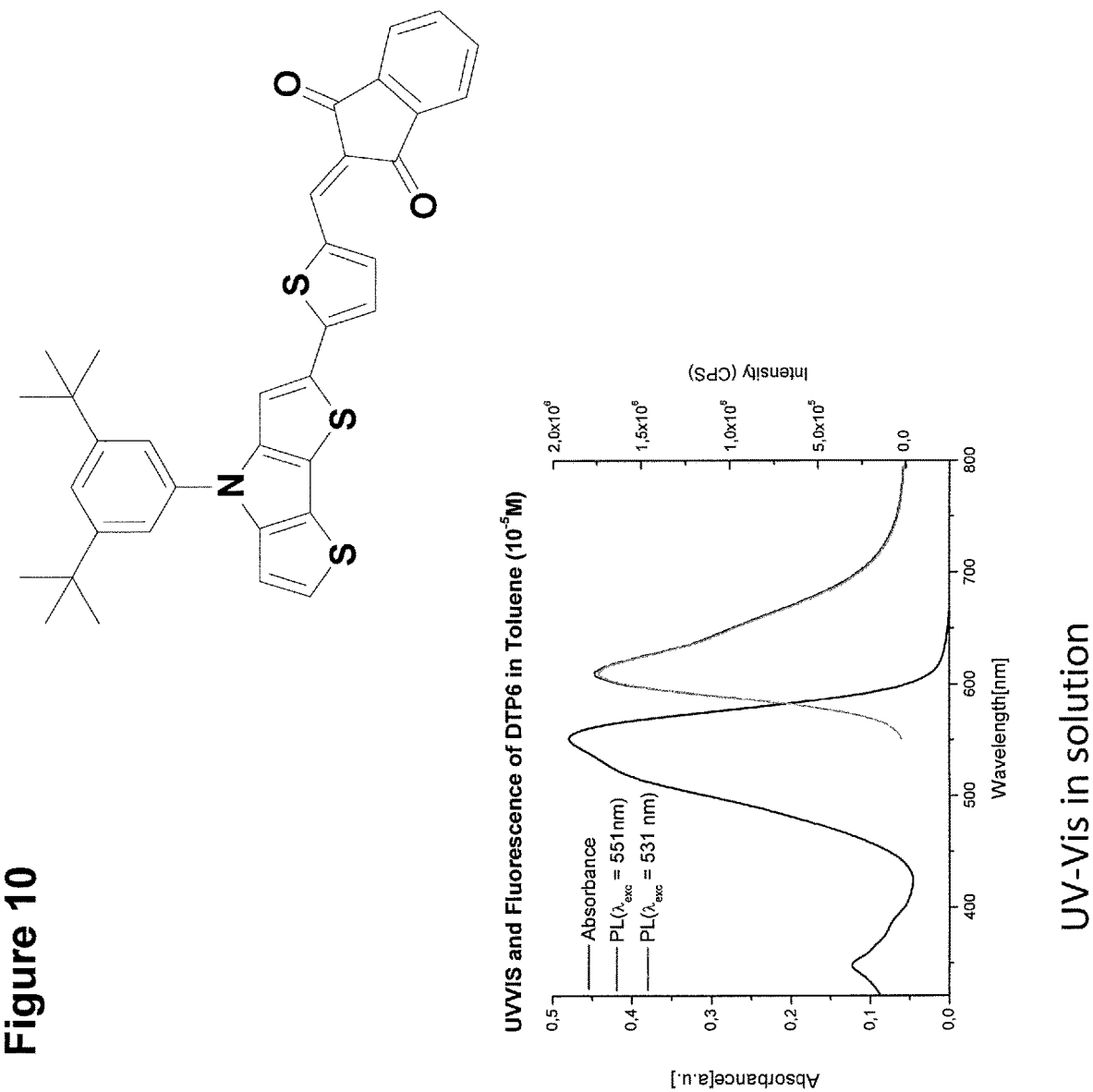
FIG. 10 shows the thiophene-based molecule of Example 5 and its absorption in solution.

The absorption of the molecule in solution fits with the requirements (see FIG. 10).

Example 6

Thiophene Molecule

A further thiophene molecule derivative was used, called methyl bithieno-thienothiophene indandione (m-BT-TT)

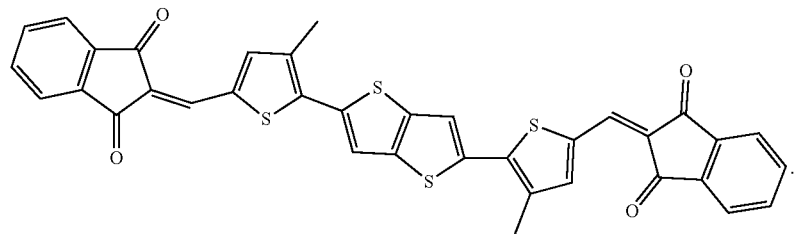 [SMILES: Cc1cc(C=C2C(=O)c3ccccc3C2=O)sc1-c1cc2sc(-c3sc(C=C4C(=O)c5ccccc5C4=O)cc3C)cc2s1]

Figure 11:
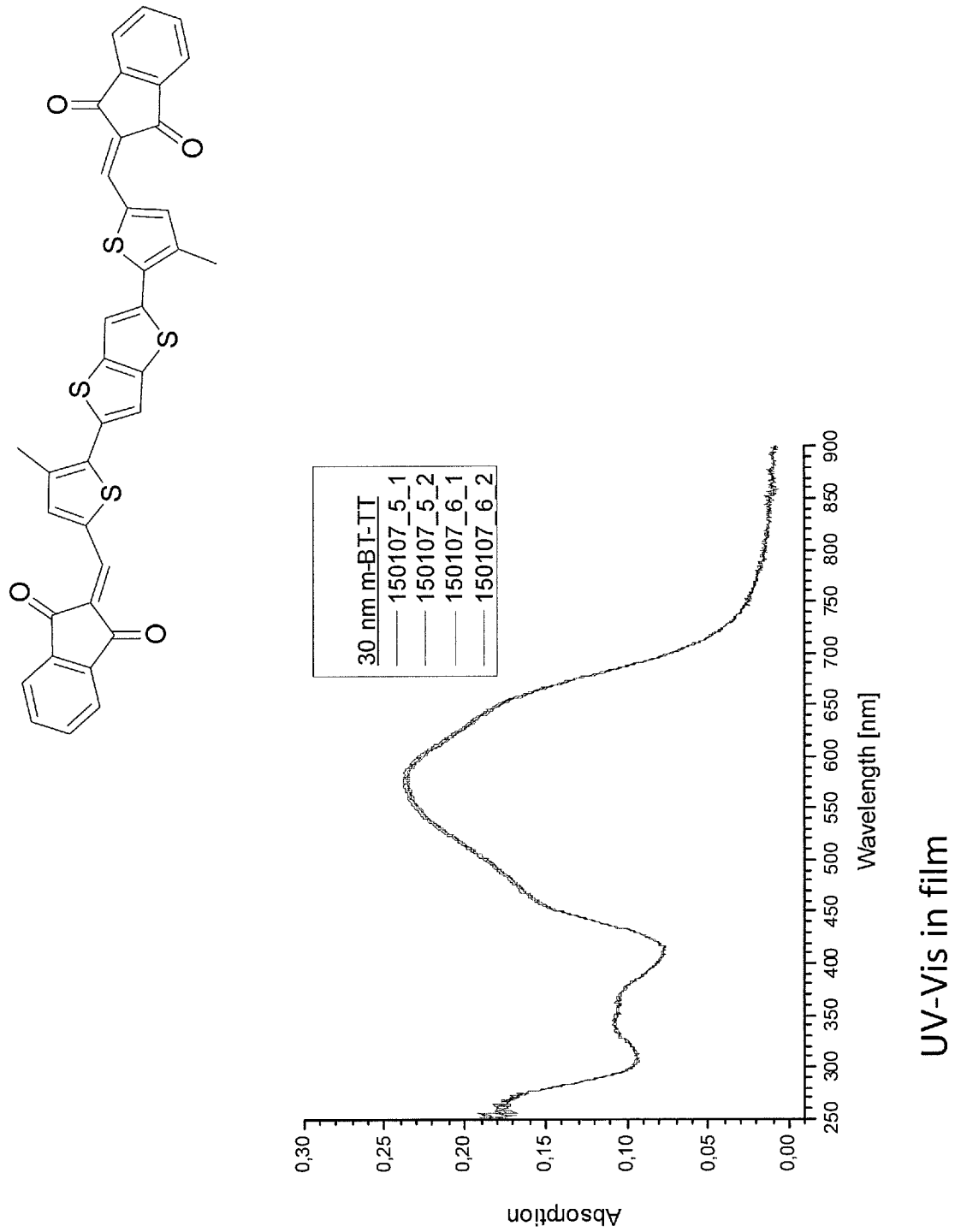
FIG. 11 shows the thiophene-based molecule of Example 6 and its absorption in solution.

The absorption of the molecule in solution fits with the requirements (see FIG. 11).

Example 7

Thiophene Molecule

A further thiophene molecule derivative was used, called benzodithieno-thiphene-indandione (Th-1)

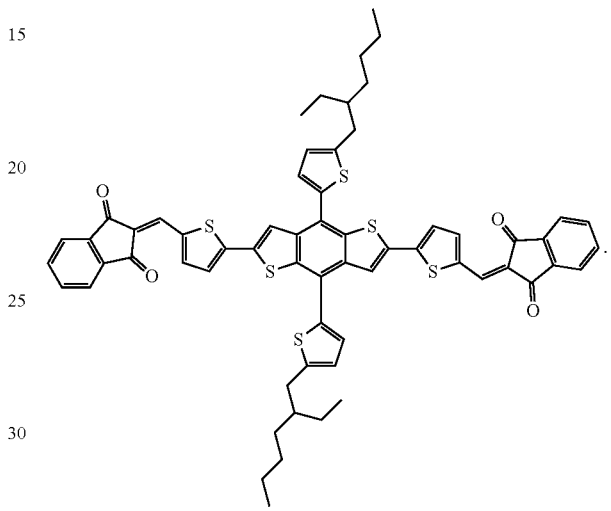

Figure 12:
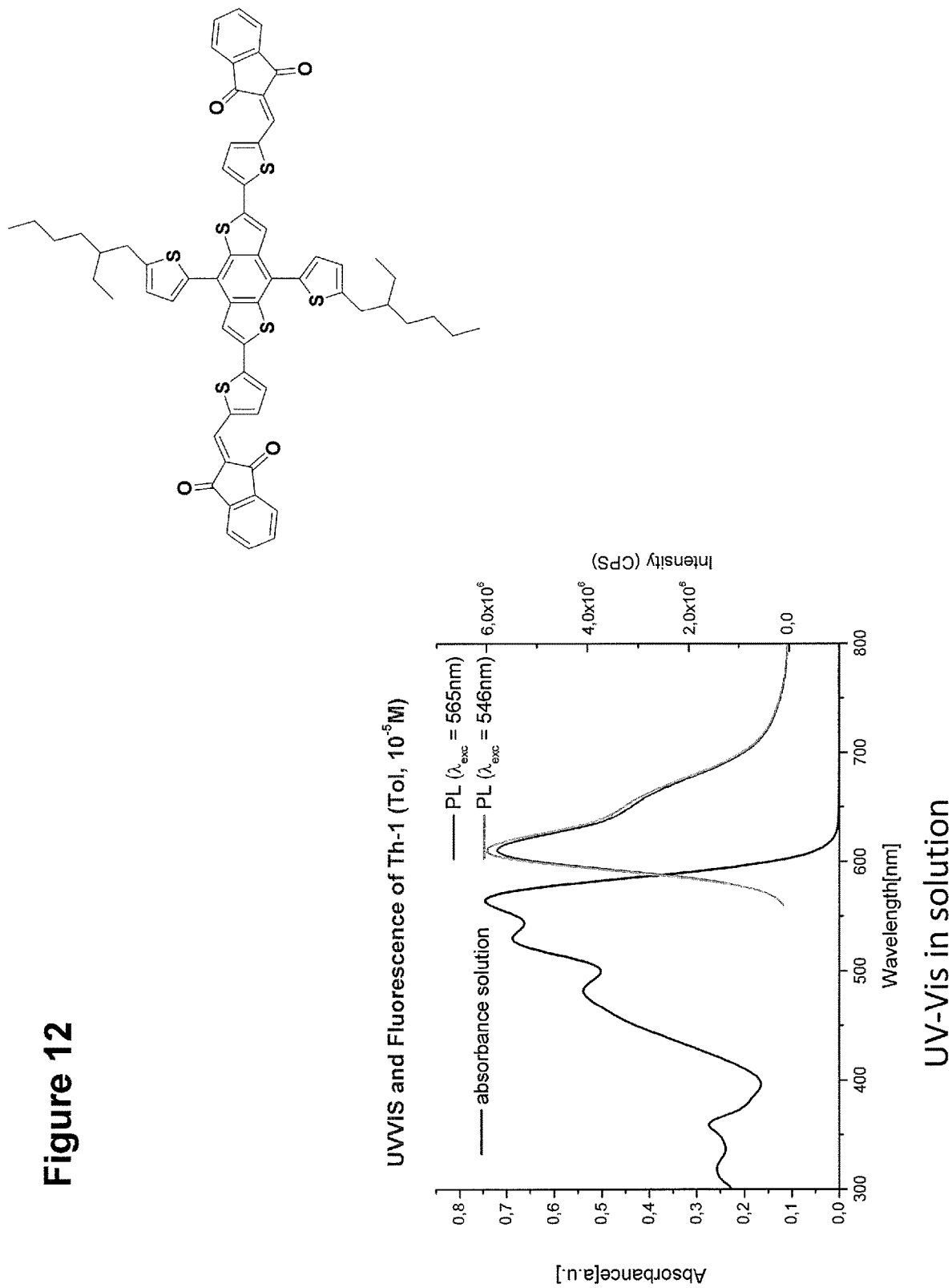
FIG. 12 shows the thiophene-based molecule of Example 7 and its absorption in solution.

The absorption of the molecule in solution fits with the requirements (see FIG. 12).

Thus, the foregoing discussion discloses and describes merely exemplary embodiments of the present disclosure. As will be understood by those skilled in the art, the present disclosure may be embodied in other specific forms without departing from the spirit or essential characteristics thereof. Accordingly, the disclosure of the present disclosure is intended to be illustrative, but not limiting of the scope of the disclosure, as well as other claims. The disclosure, including any readily discernible variants of the teachings herein, define, in part, the scope of the foregoing claim terminology such that no inventive subject matter is dedicated to the public.

The invention claimed is:

1. A squaraine molecule of a formula selected from the group consisting of

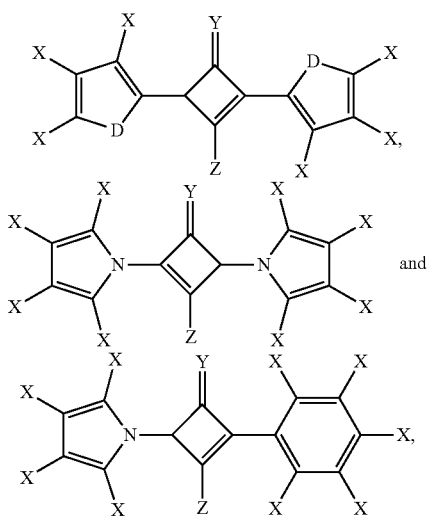

wherein

D is S or O;

X is selected from the group consisting of H, OH, SH, $NH_2$, NHR, $NR_2$, $NO_2$, alkyl, alkoxy, aryl, aryloxy, and halogen;

Y is selected from the group consisting of O, S, NH, NR,

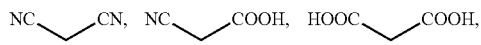

indanedione, barbituric acid and thiobarbituric acid;

Z is selected from the group consisting of OH, SH, $NH_2$, $NR_2$; and

R, at each occurrence, is H or any straight or branched alkyl chain of general formula —$C_nH_{2n+1}$, or —$COOR^1$, —$OR^1$, —$SR^1$, —$NR^1_2$, or F, Cl, Br, I, O, N, $NO_2$, CN, $CF_3$, where $R^1$ is H or any straight or branched alkyl chain of general formula —$C_nH_{2n+1}$, or any substituted or non-substituted phenyl or biphenyl, heteroaryl, and n=0-12.

2. A squaraine molecule of a formula selected from the group consisting of:

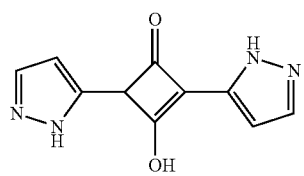

3-Hydroxy-2,4-bis-(2H-pyrazol-3-yl)-cyclobut-2-enone

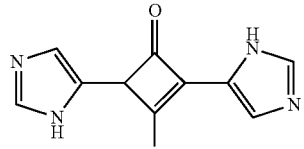

3-Hydroxy-2,4-bis-(3H-imidazol-4-yl)-cyclobut-2-enone

-continued

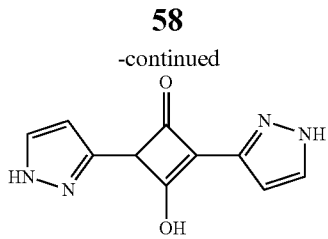

3-Hydroxy-2,4-bis-(1H-pyrazol-3-yl)-cyclobut-2-enone

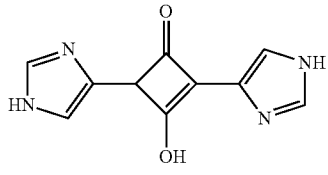

3-Hydroxy-2,4-bis-(1H-imidazol-4-yl)-cyclobut-2-enone

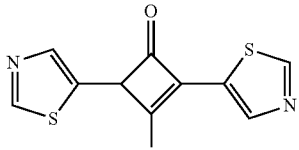

3-Hydroxy-2,4-bis-thiazol-5-yl-cyclobut-2-enone

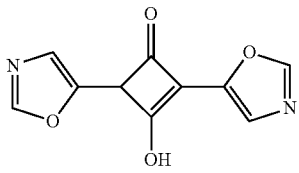

3-Hydroxy-2,4-bis-oxazol-5-yl-cyclobut-2-enone

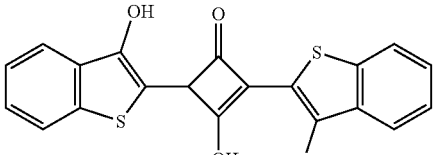

3-Hydroxy-2,4-bis-(3-hydroxy-benzo[b]thiophen-2-yl)-cyclobut-2-enone

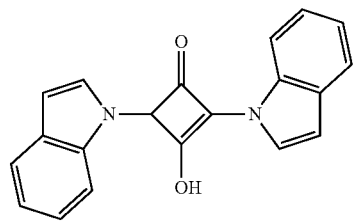

3-Hydroxy-2,4-bis-indol-1-yl)-cyclobut-2-enone and

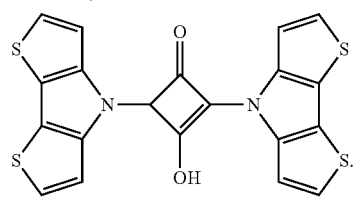

2,4-Bis-dithieno[3,2-b;2',3'-d]pyrrol-4-yl-3-hydroxy-cyclobut-2-enone

3. A squaraine molecule of a formula,

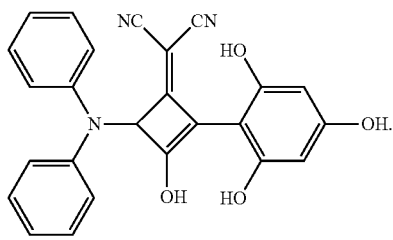

2-[4-Diphenylamino-3-hydroxy-2-
(2,4,6-trihydroxy-phenyl)-cyclobut-
2-enylidene]-malononitrile 4. The squaraine molecule according to claim 1, wherein the squaraine molecule exhibits absorption in the visible wavelength range of about 400 to about 700 nm and exhibits no absorption in the IR range of above 700 nm.

5. The squaraine molecule according to claim 1, wherein the squaraine molecule absorbs in the blue absorption range or absorbs in the green absorption range or absorbs in the red absorption range, absorbs less than 20% of the maximum absorption outside of a main range of absorption, and/or exhibits a high photoelectric conversion efficiency of more than 15%.

6. A photoelectric conversion layer, comprising:
the squaraine molecule of claim 1.

7. An absorption layer, comprising:
the squaraine molecule of claim 1,
wherein the squaraine molecule exhibits absorption in the visible wavelength range of about 400 to about 700 nm and, optionally, exhibits absorption in the IR range of above 700 nm.

8. A filter, comprising:
the squaraine molecule according to claim 1,
wherein the squaraine molecule exhibits absorption in the visible wavelength range of about 400 to about 700 nm and, optionally, exhibits absorption in the IR range of above 700 nm.

9. A device, comprising:
the photoelectric conversion layer of claim 6,
wherein the device is one of an organic image sensor, an hybrid image sensor, a photodiode, an organic photovoltaics, an organic light-emitting diode, and an organic thin-film transistor.

10. The device according to claim 9, wherein the photoelectric conversion layer exhibits photo response in the visible absorption range.

11. The device according claim 9, further comprising:
a further molecule.

12. An organic image sensor, comprising:
an organic photoelectric conversion unit comprising the photoelectric conversion layer of claim 6;
at least one electrode;
a substrate; and
optionally, a second electrode on top of the photoelectric conversion layer.

13. A hybrid silicon-organic image sensor or organic image sensor, comprising
an organic photoelectric conversion unit or units comprising the photoelectric conversion layer of claim 6;
optionally, a Si based photoelectric conversion unit;
metal wiring;
a CMOS substrate; and
an insulating layer.

14. The organic image sensor according to claim 12, wherein the organic photoelectric conversion unit comprises different layers comprising n-type material, p-type material, n-buffer layer and/or p-buffer layer or a combination or a mixture thereof.

15. A method for synthesizing the squaraine molecule of claim 1, comprising:
attaching a donor group to a core of the formula by reacting a reagent with squaric acid in a refluxing azeotropic water removal mixture, or attaching the first donor group to the core of the formula by reacting a reagent with diethyl squarate in the presence of alkylamine as catalyst; and
after deprotecting an ester with aqueous NaOH, reacting a semiquarate precursor with the second donor molecule in the refluxing azeotropic water removal mixture.

16. The squaraine molecule according to claim 1, wherein the formula is selected from the group consisting of

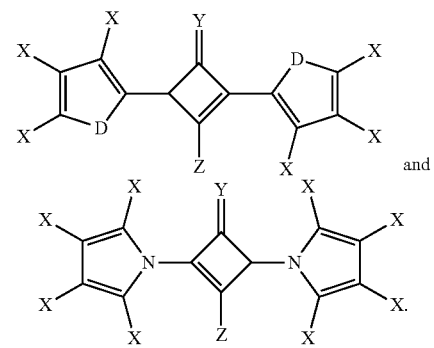

and

17. The squaraine molecule according to claim 16, wherein the squaraine molecule exhibits absorption in the visible wavelength range of about 400 to about 700 nm and exhibits no absorption in the IR range of above 700 nm.

18. The squaraine molecule according to claim 16, wherein the squaraine molecule absorbs in the blue absorption range or absorbs in the green absorption range or absorbs in the red absorption range, absorbs less than 20% of the maximum absorption outside of a main range of absorption, and/or exhibits a high photoelectric conversion efficiency of more than 15%.

19. The squaraine molecule according to claim 1, wherein the formula is

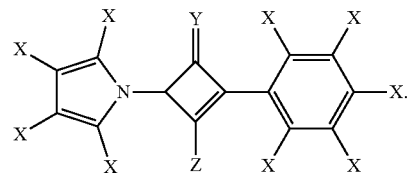

20. The squaraine molecule according to claim 19, wherein the squaraine molecule exhibits absorption in the visible wavelength range of about 400 to about 700 nm and exhibits no absorption in the IR range of above 700 nm.

21. The squaraine molecule according to claim 19, wherein the squaraine molecule absorbs in the blue absorption range or absorbs in the green absorption range or absorbs in the red absorption range, absorbs less than 20% of the maximum absorption outside of a main range of absorption, and/or exhibits a high photoelectric conversion efficiency of more than 15%.

22. The squaraine molecule according to claim 1, wherein Y is selected from the group consisting of S, NH, NR,

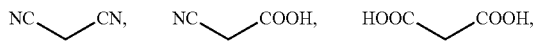

indanedione, barbituric acid and thiobarbituric acid.

23. The squaraine molecule according to claim 22, wherein the squaraine molecule exhibits absorption in the visible wavelength range of about 400 to about 700 nm and exhibits no absorption in the IR range of above 700 nm.

24. The squaraine molecule according to claim 22, wherein the squaraine molecule absorbs in the blue absorption range or absorbs in the green absorption range or absorbs in the red absorption range, absorbs less than 20% of the maximum absorption outside of a main range of absorption, and/or exhibits a high photoelectric conversion efficiency of more than 15%.

25. The squaraine molecule according to claim 16, wherein Y is selected from the group consisting of S, NH, NR,

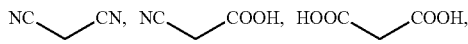

indanedione, barbituric acid and thiobarbituric acid.

26. The squaraine molecule according to claim 16, wherein the squaraine molecule exhibits absorption in the visible wavelength range of about 400 to about 700 nm, exhibits no absorption in the IR range of above 700 nm, absorbs less than 20% of the maximum absorption outside of a main range of absorption, and exhibits a high photoelectric conversion efficiency of more than 15%.

27. The squaraine molecule according to claim 19, wherein Y is selected from the group consisting of S, NH, NR,

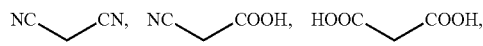

indanedione, barbituric acid and thiobarbituric acid.

28. The squaraine molecule according to claim 19, wherein the squaraine molecule exhibits absorption in the visible wavelength range of about 400 to about 700 nm, exhibits no absorption in the IR range of above 700 nm, absorbs less than 20% of the maximum absorption outside of a main range of absorption, and exhibits a high photoelectric conversion efficiency of more than 15%.

* * * * *